US012696478B2

(12) United States Patent
Martinez-Limia et al.

(10) Patent No.: US 12,696,478 B2
(45) Date of Patent: Jul. 28, 2026

(54) VERTICAL SEMICONDUCTOR COMPONENT, AND METHOD FOR ITS PRODUCTION

(71) Applicant: Robert Bosch GmbH, Stuttgart (DE)

(72) Inventors: Alberto Martinez-Limia, Pliezhausen (DE); Daniel Krebs, Aufhausen (DE); Stephan Schwaiger, Bodelshausen (DE); Wolfgang Feiler, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 529 days.

(21) Appl. No.: 18/250,580

(22) PCT Filed: Nov. 17, 2021

(86) PCT No.: PCT/EP2021/081968
§ 371 (c)(1),
(2) Date: Apr. 26, 2023

(87) PCT Pub. No.: WO2022/106458
PCT Pub. Date: May 27, 2022

(65) Prior Publication Data
US 2023/0402538 A1 Dec. 14, 2023

(30) Foreign Application Priority Data
Nov. 17, 2020 (DE) ..................... 10 2020 214 398.6

(51) Int. Cl.
*H10D 30/66* (2025.01)
*H10D 30/01* (2025.01)
(Continued)

(52) U.S. Cl.
CPC ....... *H10D 30/665* (2025.01); *H10D 30/0297* (2025.01); *H10D 30/668* (2025.01);
(Continued)

(58) Field of Classification Search
CPC ............. H10D 12/031; H10D 30/0297; H10D 30/665; H10D 30/668; H10D 62/10; H10D 62/106; H10D 62/151; H10D 62/8325
(Continued)

(56) References Cited

U.S. PATENT DOCUMENTS

2008/0087951 A1 4/2008 Takaya et al.
2016/0020279 A1 1/2016 Turner et al.
(Continued)

FOREIGN PATENT DOCUMENTS

DE 102017127848 A1 5/2019
JP 2012004312 A 1/2012
(Continued)

OTHER PUBLICATIONS

International Search Report for PCT/EP2021/081968, Issued Feb. 16, 2022.

*Primary Examiner* — Fazli Erdem
(74) *Attorney, Agent, or Firm* — NORTON ROSE FULBRIGHT LLP

(57) ABSTRACT

A vertical semiconductor component. The component includes: a drift region having a first conductivity type; a trench structure on or above the drift region, a shielding structure situated laterally next to at least one sidewall of the trench structure on or above the drift region and having a second conductivity type, and the shielding structure having at least a part of a shielding structure-trench structure such that the shielding structure has at least a first region having a first thickness and a second region having a second thickness, and an edge termination structure on or above the drift region and having the second conductivity type, and the shielding structure having a first doping degree, and the edge termination structure having a second doping degree; and at least in the second region of the shielding structure, the edge
(Continued)

termination structure being situated between the drift region and the shielding structure.

10 Claims, 20 Drawing Sheets

(51) Int. Cl.
    *H10D 62/10*           (2025.01)
    *H10D 62/13*           (2025.01)
    *H10D 62/832*         (2025.01)
(52) U.S. Cl.
    CPC ........... *H10D 62/10* (2025.01); *H10D 62/151*
               (2025.01); *H10D 62/8325* (2025.01)
(58) Field of Classification Search
    USPC ........................................................ 257/330
    See application file for complete search history.

(56)                References Cited

U.S. PATENT DOCUMENTS

2018/0151366 A1*   5/2018   Endo ...................... H10D 30/60
2020/0266270 A1*   8/2020   Ohnishi .............. H10D 64/112

FOREIGN PATENT DOCUMENTS

JP         2020170807 A    10/2020
WO       2013132568 A1    9/2013
WO       2016104264 A1    6/2016

* cited by examiner

2000 develop drift region
of first conductivity
type — 2008 develop trench
structure on or above
drift region — 2010 develop shielding
structure — 2020 develop edge
termination structure — 2030

VERTICAL SEMICONDUCTOR COMPONENT, AND METHOD FOR ITS PRODUCTION

FIELD

A vertical semiconductor component and a method for its production are provided.

BACKGROUND INFORMATION

In conventional transistors (such as MOSFETs or MIS-FETs), the actively switchable component is provided by an inversion channel, e.g., by the p-region in an npn-junction, in which an electron path is developed by applying a gate voltage. For the use of semiconductors featuring a broad band gap (e.g., silicon carbide (SiC) or gallium nitride (GaN)) in power electronics, the use of what is known as vertical power MOSFETs featuring a trench gate may be advantageous. One example of such a power MOSFETs 100 is schematically illustrated in FIG. 1.

Power MOSFET 100 is in essence made up of an active region 110 and an edge termination 120. In the illustrated power MOSFET 100, an n-doped drift region 1 is situated on an n-doped semiconductor substrate 2. Optionally, an n-doped nBuffer zone 4 may be situated between semiconductor substrate 2 and drift region 1.

A source electrode 12, a drain electrode 13, and a gate electrode 11 are situated in active region 110. In active region 110, power MOSFET 100 furthermore has a heavily p-doped (p+) region 3, an n-doped distribution region 8 (also referred to as spreading region), a p-doped channel region 5, an n-doped source region 6, a dielectric (e.g., intermediate oxide) 10, a gate trench 18, and a gate oxide 9.

In edge termination 120, power MOSFET 100 has a p-doped edge termination structure 15. It is furthermore also possible to provide a heavily n-doped (n+) channel stopper 7 and/or a channel stop metal 14 in edge termination 120.

Active region 110 is generally used to control the current flow (e.g., a high current in the forward case; only low blocking currents in a blocking case) and is usually made up of a large number of identical cells switched in parallel. The blocking capability of such a power MOSFET 100 in the upward direction is basically restricted by the avalanche effect that sets in at a high voltage due to the occurring high field strengths. Active region 110 and other regions such as a gate pad can absorb high blocking voltages only in a vertical direction. High electric fields form at its periphery in response to an increasing voltage because the involved planar pn-junctions have a relatively small curvature radius. These high electric fields may lead to an avalanche even under a fraction of the vertical blocking capability of these regions.

To allow for the absorption of a high blocking voltage BVds of a few volt (V) up to multiple kV given only a low blocking current, power MOSFET 100 thus requires an edge termination 120. Edge termination 120 encloses the components of active region 110 of power MOSFET 100 in the lateral direction and reduces the mentioned electrical fields even at high voltages. In the ideal case, a breakdown in edge region 120 to achieve a high avalanche strength only takes place above the breakdown voltage of the other regions of active region 110 of power MOSFET 100.

In comparison with silicon (Si) MOSFETs, power MOS-FETs 100 that are based on silicon carbide (SiC) offer the advantage of a breakdown strength that is greater by approximately an order of magnitude. This allows for more highly doped drift regions 1 having a lower thickness at a comparable blocking capability in SiC power MOSFET 100. In an application-specific manner, this is advantageous for the resistance of the power MOSFET in a forward case $R_{on}$. The high fields occur especially in the "upper" region of power MOSFET 100 illustrated in FIG. 1. The MOS control head with gate oxide 9 is situated in the upper region of active region 110. To prevent gate oxide 9 from being exposed to excessively high fields above 3 MV/cm, for instance, which would reduce its reliability, deep p+ regions 3 having a depth of >1 μm are usually provided in edge region 120 of power MOSFET 100.

Since the diffusion constant of dopants is very low in SiC, the regions to be doped must be produced with the aid of an implantation without the option of utilizing the diffusion available with silicon for driving the dopants into the depth.

This basically requires multiple implantations using different energies and doses per doping profile. For deep regions, very high implantation energies of >1 MeV are required. The activation of dopants is subsequently realized with the aid of a temperature step. The deep p+ regions constrict the vertical current flow in the forward case in the region of the MOS control head. To achieve a low resistance of MOSFET 100 in forward case $R_{on}$ despite the current restriction, it is optionally possible to introduce a spreading region 8, which is doped to a greater extent than drift region 1, between the p+ regions, for instance with the aid of an implantation.

For edge termination 120, what is known as a junction termination extension (JTE) (blocking layer termination expansion) is conventionally developed with the aid of edge termination structure 15. At the lateral end of p+ region 3, JTE region pEdge 15 is no flatter (has no lower depth) than the pn-junction, to be protected, of p+ region 3 including n-drift region 1. In this way, a high blocking capability of edge termination 120 of the order of magnitude of the breakdown voltage of the equivalent one-dimensional pn-junction is achieved. This requires an effective total dose of edge termination structure 15, which lies in the order of magnitude of the effective breakdown charge of the used semiconductor material. The total dose is therefore far below the dose of p+ region 3 to be protected. The breakdown voltage is only moderately tolerant of deviations from the effective total dose of edge termination structure 15 and of surface charges at the semiconductor/oxide boundary surface or in the passivation that is situated above oxide 10 (not illustrated). The sensitivity of the breakdown voltage to dose deviations becomes greater as the doping of drift region 1 increases. This applies especially to dopings considerably above $10^{15}$ cm$^{-3}$ as typical for SiC components for the voltage class 1200 V or below.

The development of a deep p+ region 3 and an edge termination structure 15 with the aid of an implantation requires high implantation energies. However, edge termination structure 15 should be at least as deep and, ideally, deeper than the p+ region 3. However, since edge termination structure 15 is flatter than p+ region 3 at the same maximum implantation energy due to its lower dose, it would be necessary to develop edge termination structure 15 using an even higher implantation energy than the p+ region 3. Since a very high maximum implantation energy is already used for p+ region 3, an even higher implantation energy is required to develop edge termination structure 15.

SUMMARY

One object of the present invention is to provide a vertical semiconductor component in which at least at the lateral end of a doped semiconductor region, the edge termination structure is not significantly flatter than the pn-junction of the doped semiconductor region to be protected. The edge termination structure should not require a higher implantation energy than the doped semiconductor region.

According to one aspect of the present invention, the object is achieved by a vertical semiconductor component, which includes: a drift region having a first conductivity type, a trench structure situated on or above the drift region or in its upper part, a shielding structure, which is situated laterally next to at least one sidewall of the trench structure on or above the drift region or in its upper part, the shielding structure having a second conductivity type which differs from the first conductivity type, and the shielding structure has at least a part of a shielding structure-trench structure such that the shielding structure has at least a first region having a first thickness and a second region having a second thickness that is less than the first thickness; and an edge termination structure situated on or above the drift region or in its upper part, the edge termination structure having the second conductivity type, the shielding structure having a first doping degree and the edge termination structure having a second doping degree that differs from the first doping degree; and at least in the second region of the shielding structure, the edge termination structure is situated between the drift region and the shielding structure.

The semiconductor component is able to be used in power-electronics applications. Among these are, for instance, automotive inverters (electric or hybrid vehicles). In the non-automotive field, numerous applications are possible such as in photovoltaics or in wind power inverters (regenerative energy generation), traction drives, or in the transmission of high voltage-direct current in high-voltage rectifiers.

According to a further aspect of the present invention, the object is achieved by a method for producing a vertical semiconductor component. The semiconductor component is set up as described above. The method includes: Developing a drift region having a first conductivity type; developing a trench structure on or above the drift region or in its upper part, developing a shielding structure which is situated laterally next to at least one sidewall of the trench structure on or above the drift region or in its upper part, the shielding structure having a second conductivity type which differs from the first conductivity type, and the shielding structure has at least a part of a shielding structure-trench structure such that the shielding structure has at least a first region having a first thickness and a second region having a second thickness that is less than the first thickness; and developing an edge termination structure on or above the drift region or in its upper part, the edge termination structure having the second conductivity type, the shielding structure having a first doping degree, and the edge termination structure having a second doping degree that differs from the first doping degree; the edge termination structure being situated between the drift region and the shielding structure at least in the second region of the shielding structure.

Further refinements of the aspects are disclosed herein. Embodiments of the present invention are illustrated in the figures and will be described in greater detail in the following text.

DETAILED DESCRIPTION OF EXAMPLE EMBODIMENTS

Figure 1:
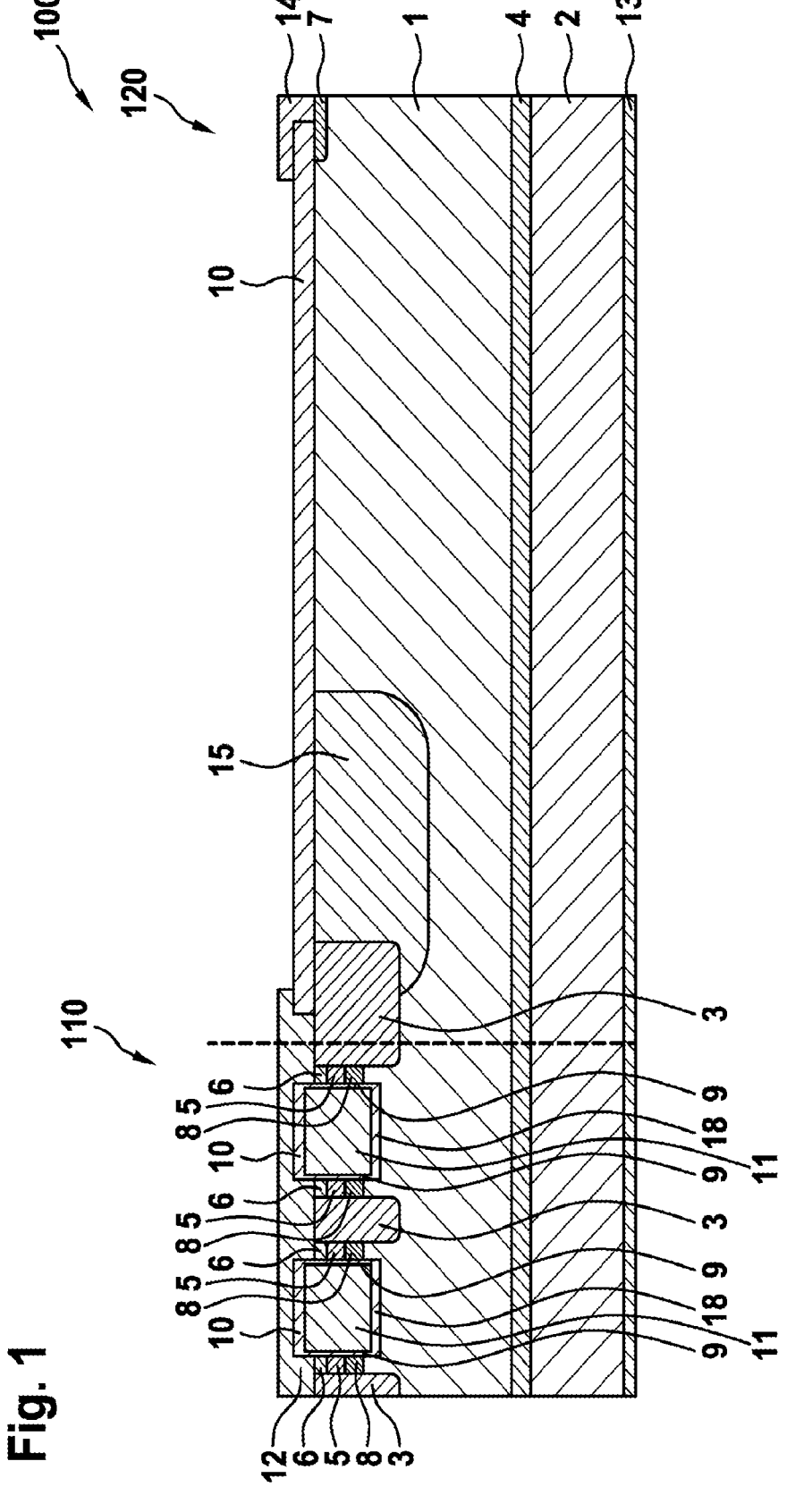
FIG. 1 shows a schematic representation of a semiconductor component of the referenced technology.

In the following detailed description, reference is made to the appended drawings which constitute part of this description and in which specific exemplary embodiments are shown for illustration purposes, for which the present invention can be used. It is understood that other exemplary embodiments may be used, and structural or logical modifications can be made without deviating from the protective scope of the present invention. It is understood that the features of the different exemplary embodiments described herein are able to be combined with one another provided nothing specific is stated to the contrary. Therefore, the following, detailed description should not be interpreted in a restricting sense. To the extent that this appeared useful, identical or similar elements in the figures have been provided with identical reference numerals.

FIG. 2 to FIG. 19 show schematic representations of a vertical semiconductor component 200 according to different embodiments. Vertical semiconductor component 200, for example, is an re-channel SiC trench MOSFET. Vertical semiconductor component 200 has an active region 110, which has a similar development as active region 110 illustrated in FIG. 1. However, in a deviation from semiconductor component 100 shown in FIG. 1, vertical semiconductor component 200 has a different edge termination 220, of which different embodiments are illustrated in FIG. 2 to FIG. 19.

In different embodiments, vertical semiconductor component 200 has a drift region 21 (in active region 110 in FIG. 1 denoted as drift region 1) on a semiconductor substrate 22 (in active region 110 in FIG. 1 denoted as semiconductor substrate 2). Semiconductor substrate 22, for instance, may be a GaN substrate or an SiC substrate. The lightly n-conductive semiconductor drift region (also referred to as drift region 21) may be developed (e.g., applied) on semiconductor substrate 22, e.g., a GaN or an SiC drift region. Above drift region 21 or in its upper part, a trench structure may be developed in active region 110. The trench structure (whose longitudinal extension extends perpendicular to the drawing plane) may thus be developed on or above drift region 21.

In addition, vertical semiconductor component 200 has a first source/drain electrode (such as a source electrode) 212, a second source/drain electrode (such as a drain electrode) 213 (referred to as electrodes 12 and 13 in active region 110 in FIG. 1). In the following text, it is assumed by way of example that first source/drain electrode 212 is a source electrode and second source-drain electrode 213 is a drain electrode. The source and drain electrodes have an Ohmic contact with the abutting semiconductor.

In addition, vertical semiconductor component 200 has a gate electrode 11, which is illustrated in FIG. 1, in the trench structure (also referred to as trench gate). Gate electrode 11, for instance a polysilicon (poly-Si) or a gate metal, is electrically insulated from source electrode 12, 212 with the aid of an insulation 9 (see FIG. 1), for instance a gate oxide and/or a dielectric (such as an intermediate oxide) 210. In FIG. 1, this dielectric is denoted by reference numeral 10.

An n-doped distribution region 8 (also denoted as spreading region), a p-doped channel region 5 and an n-doped source region 6 may be situated between source electrode 12, 212 and drift region 1, 21, and laterally next to gate electrode 11, gate oxide 9 separating it from gate electrode 11, as illustrated in FIG. 1.

In different embodiments, source electrode 212 is able to electrically contact the n-doped source region 6. Drain electrode 213 may be positioned on the back side of semiconductor substrate 22.

In different embodiments, a shielding structure 23 is developed laterally next to a sidewall of the trench structure or gate electrode 11. Shielding structure 23 is situated in the transition region between active region 110 and edge termination 220. Source electrode 212 is able to contact shielding structure 23 in different embodiments.

Developed laterally next to shielding structure 23 and/or between shielding structure 23 and drift region 21 (e.g., the upper part of drift region 21) is an edge termination structure 215 in edge termination 220 of semiconductor component 200.

A space-charge region 217 may develop at the pn-junctions between the regions of shielding structure 23 and drift region 21 and also between edge termination structure 215 and drift region 21 which, on account of the typical doping conditions, may predominantly extend into drift region 21 and edge termination structure 215 with an increase in the blocking voltage. Because of the introduction of edge termination structure 215, the excessive field strength at the periphery of shielding structure 23 under a blocking voltage is reduced in comparison with the variant without a shielding structure (FIG. 1). This prevents an early electrical breakdown of semiconductor component 200, for example. Edge termination structure 215 induces a change in the field distribution.

Because of a shielding structure-trench structure 23.3, which is produced prior to the implantation of edge termination structure 215 and situated in the region of the lateral end of shielding structure 23, edge termination structure 215 is not significantly flatter and optionally even deeper (in the direction of semiconductor substrate 22) than shielding structure 23 despite not using a higher maximum implantation energy (than for developing p+ doped shielding structure 23) in the lateral region. This criterion can influence the minimum lateral width, position, and also the minimum depth of shielding structure-trench structure 23.3. The maximum width of shielding structure-trench structure 23.3 may be selected so that it lies within shielding structure 23.

If source electrode 212 is connected to a reference potential, then a blocking case may exist if drain metal 213 is connected to a positive potential. A space-charge zone 217 may consequently develop in drift region 21, which may essentially extend into drift region 21 and edge termination structure 215 on account of the doping concentration conditions, e.g., doping degree (drift region 21)<<doping degree (edge termination structure 215)<<doping degree (shielding structure 23). However, space charge zone 217 extends only negligibly into shielding structure 23. If edge termination structure 215 is not considerably flatter but preferably deeper than shielding structure 23, the field strength in the region of the curvature of shielding structure 23 is reduced in comparison with a case without an edge termination structure 215 or an edge termination structure 215 which is considerably flatter than shielding structure 23, and the avalanche breakdown voltage is increased. In the case of an edge termination structure 215 having a lower doping degree than shielding structure 23, the curvatures of edge termination structure 215 may be less critical with regard to the breakdown than the curvature of shielding structure 23.

The doping degree of edge termination structure 215 may be selected in such a way that the breakdown at the curvature of shielding structure 23 occurs at the same voltage as at the end of edge termination structure 215 that is pointing to channel stopper 27, which also has a curvature there.

Edge termination structure 215 may be completely encompassed by space charge zone 217.

Figure 3:
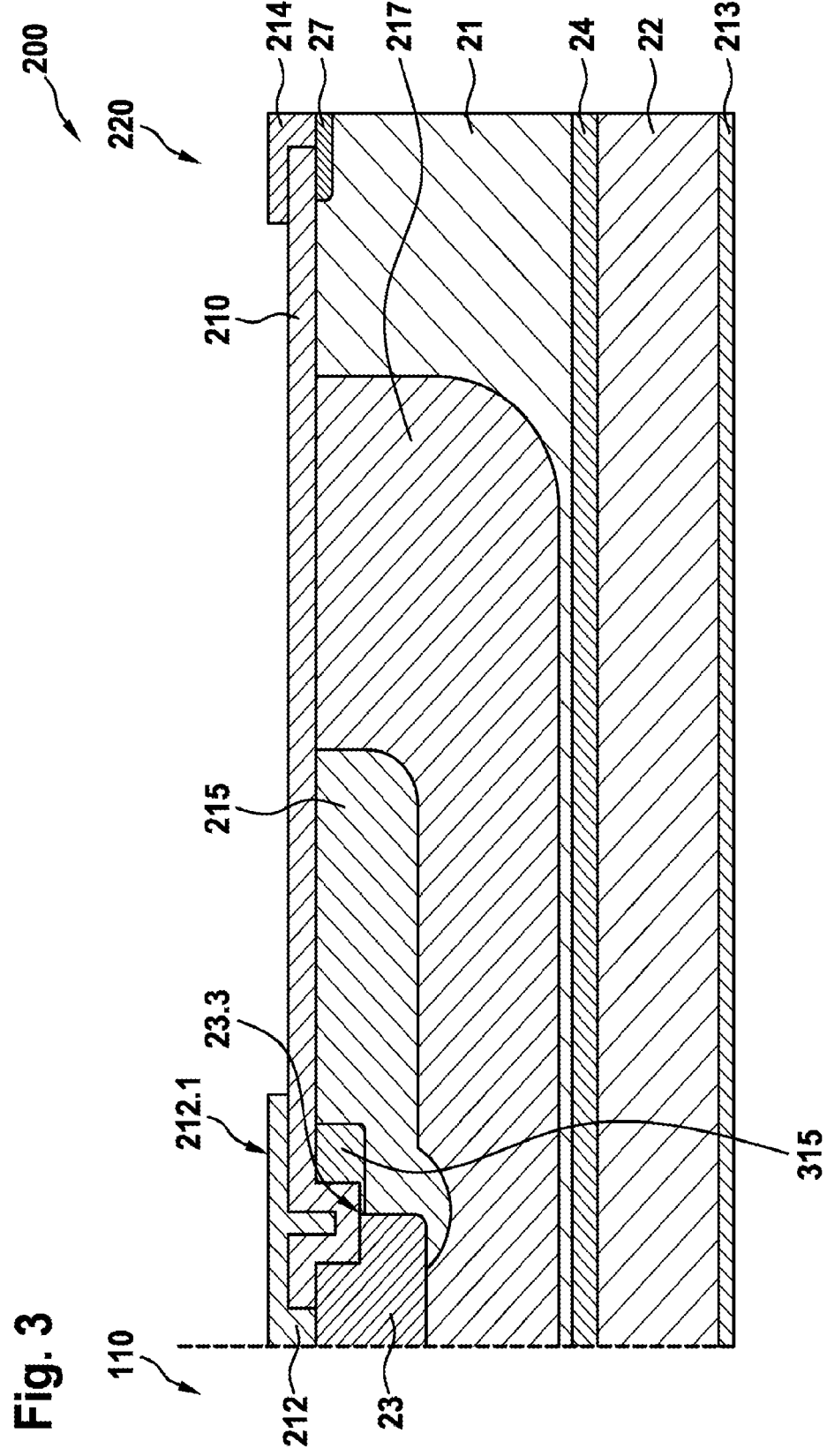

If edge termination structure 215 is not significantly flatter but also not significantly deeper than shielding structure 23, then an optimum in terms of an identical breakdown voltage may come about at the two previously mentioned points if edge termination structure 215 is not completely depleted (region 315), as illustrated in FIG. 3.

In the context of shielding structure-trench structure 23.3 or second region 23.2, this situation may make it possible that the corner (also referred to as enclosed or encompassed corner), disposed in edge termination structure 215, of shielding structure 23 then is protected from high electric fields. In different embodiments, this may even be enhanced by the use of an optional field plate 212.1 at source electrode 212.

Figure 4:
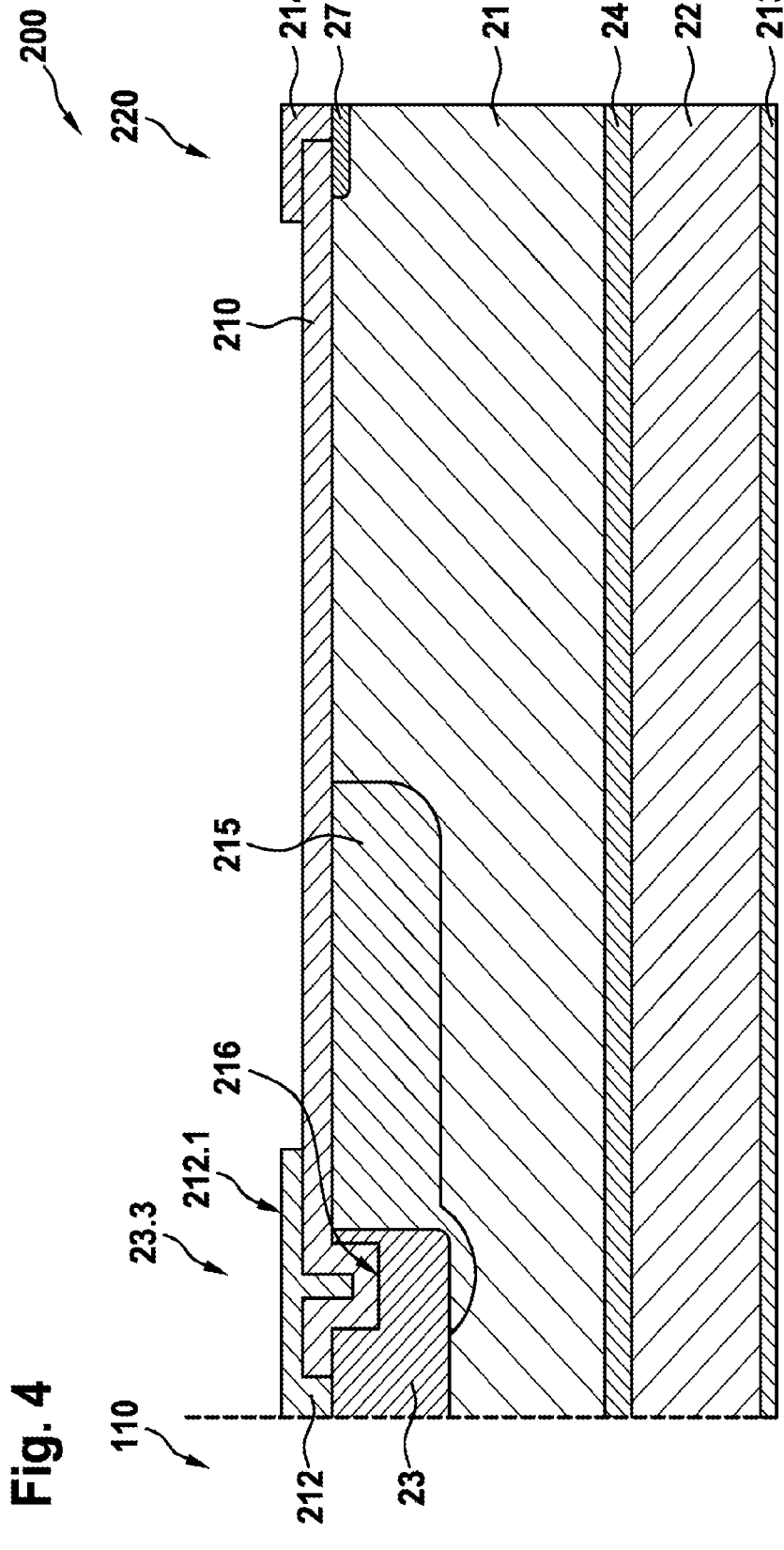

In one embodiment, as illustrated in FIG. 4, the lower corner of shielding structure-trench structure 23.3 pointing to channel stopper 27 may still be situated in shielding structure 23 (in this case, shielding structure-trench structure 23.2 has an U-shape (the radius of curvature of the U-shape possibly also leading to a rectangular form), a V-shape, or a W-shape), for example, so that shielding structure-trench structure 23.3 or bottom 216 is protected from high fields in a blockage case.

Shielding structure-trench structure 23.3 is not restricted to the described embodiments but may also be used in other design configurations. Field plate 212.1 may be optional in each case. Edge termination structure 215 and/or second edge termination structure 215.1 could be so-called junction termination extension (JTE) regions.

Figure 8:
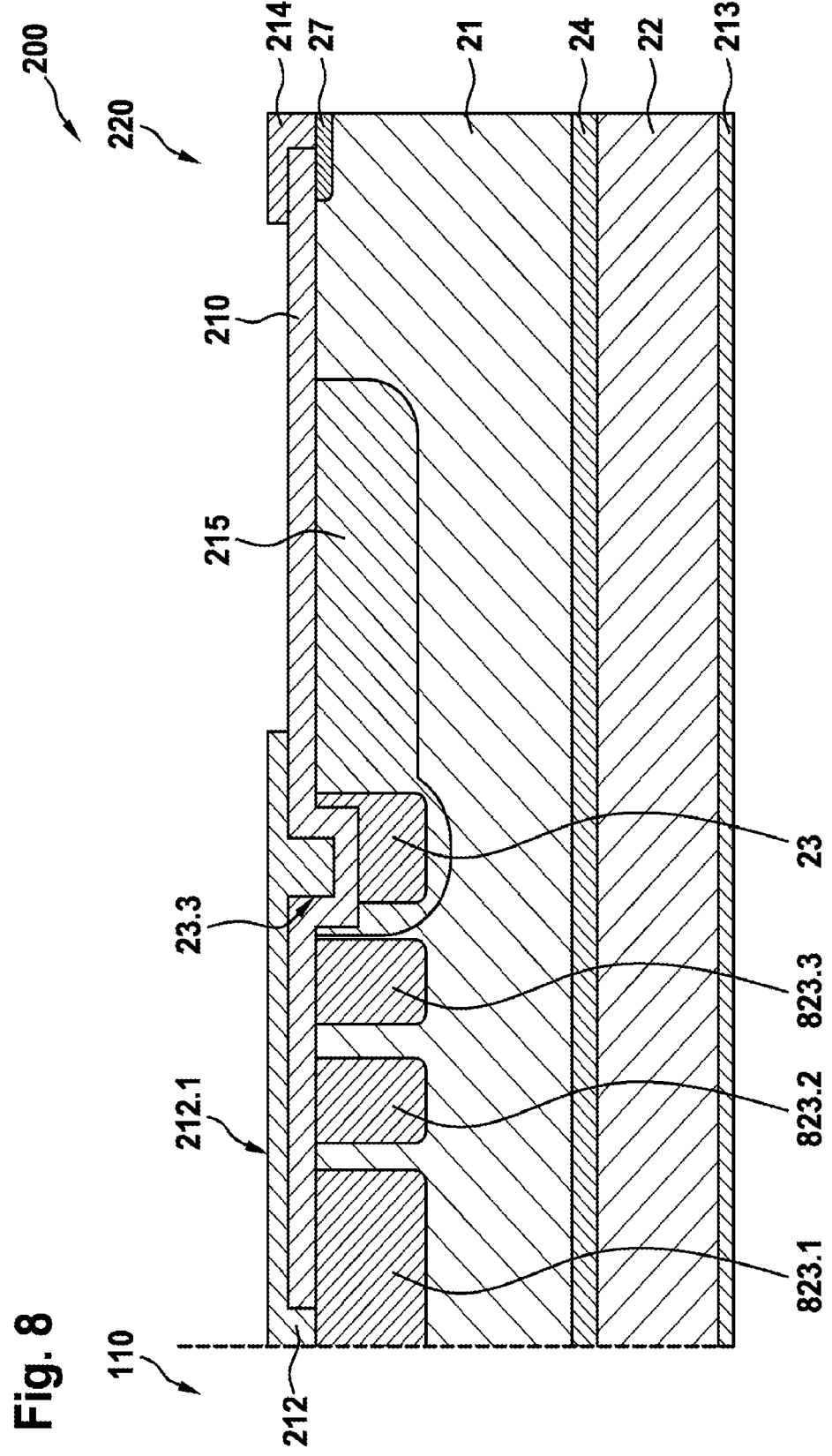
Figure 9:
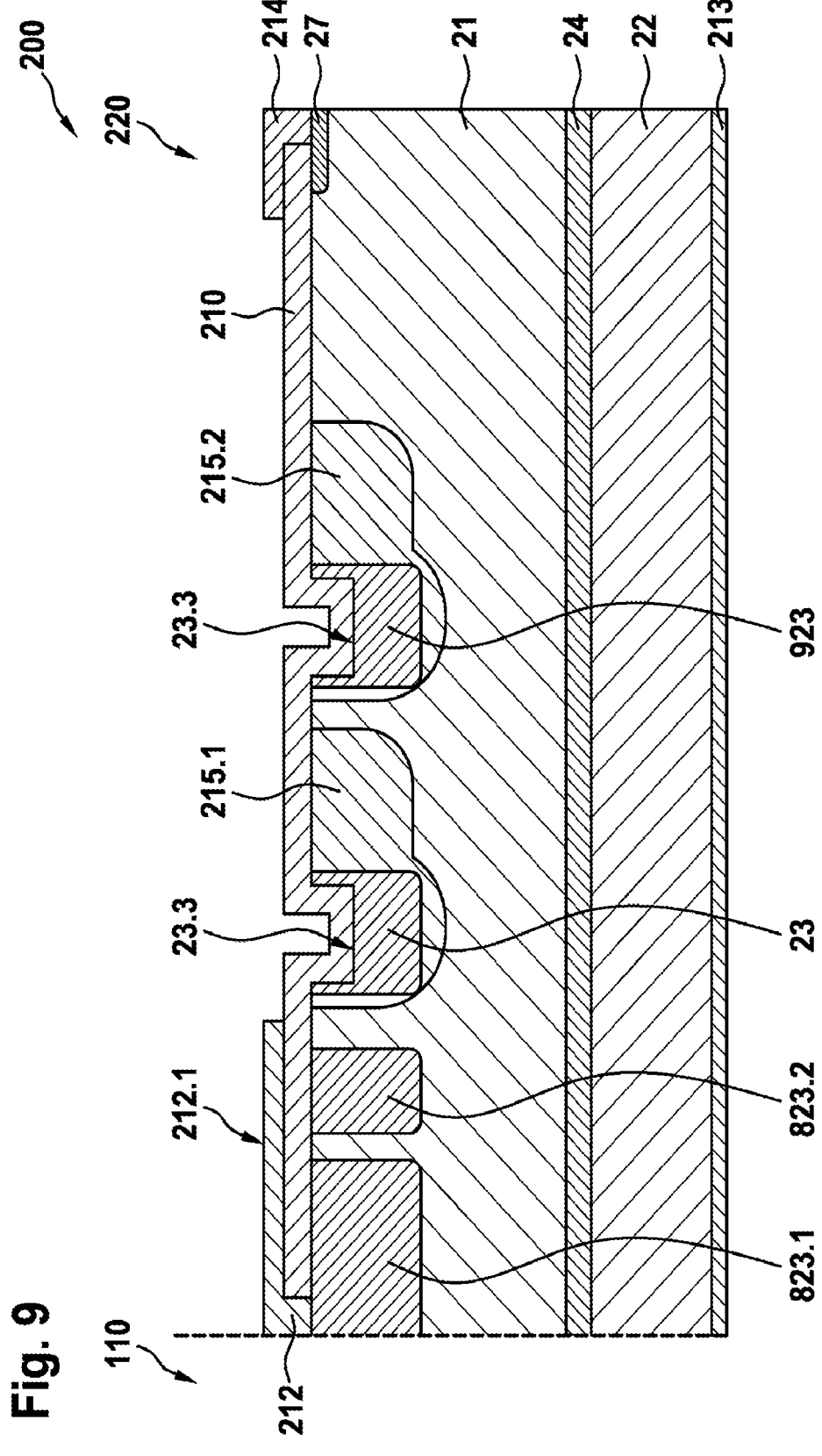

FIG. 8 illustrates the use of shielding structure/trench structure 23.3 in combination with second shielding structures (e.g., field rings) 823.1 (in the transition to the active region, illustrated as shielding structure 3 in FIG. 1), 823.2, 823.3, their number not being restricted to three. Here, shielding structure 23 of shielding structures 823.1, 823.2, 823.3, 23 is situated in such a way that it is situated at the shortest distance from channel stopper 27. Shielding structure-trench structure 23.3 may also be situated completely within shielding structure 23 in this case, as illustrated in FIG. 9. Shielding structure 23 and edge termination structure 215 are designed to be floating (electrically insulated from field plate 212.1 with the aid of dielectric structure 210) in the embodiment illustrated in FIG. 8, and edge termination structure 215 at least partially encloses shielding structure 23.

In one embodiment, as illustrated in FIG. 9, it is also possible to set up multiple floating shielding structures 23, 923 (shielding structure 923 also being referred to as a third shielding structure) featuring a first and second region and/or a shielding structure-trench structure 23.3. Optionally, second shielding structures 823.1, 823.2, 823.3 may also be set up with a shielding structure-trench structure 23.3. In the illustrated embodiment, an edge termination structure 215.1, 215.2 (for instance as a pEdge ring), which at least partially encloses shielding structure 23, 923 (e.g., p+ ring), is allocated to each shielding structure 23, 923 with a shielding structure-trench structure 23.2. Respective shielding structure-trench structure 23.2 may also be situated completely within the base area of respective shielding structures 23, 923 (such as in U, V or W shape), or at one or more ends (e.g., an L shape, mirrored L shape, an L shape turned on its head (similar to an Γ shape), a T shape, a T shape turned on its head.

Figure 10:
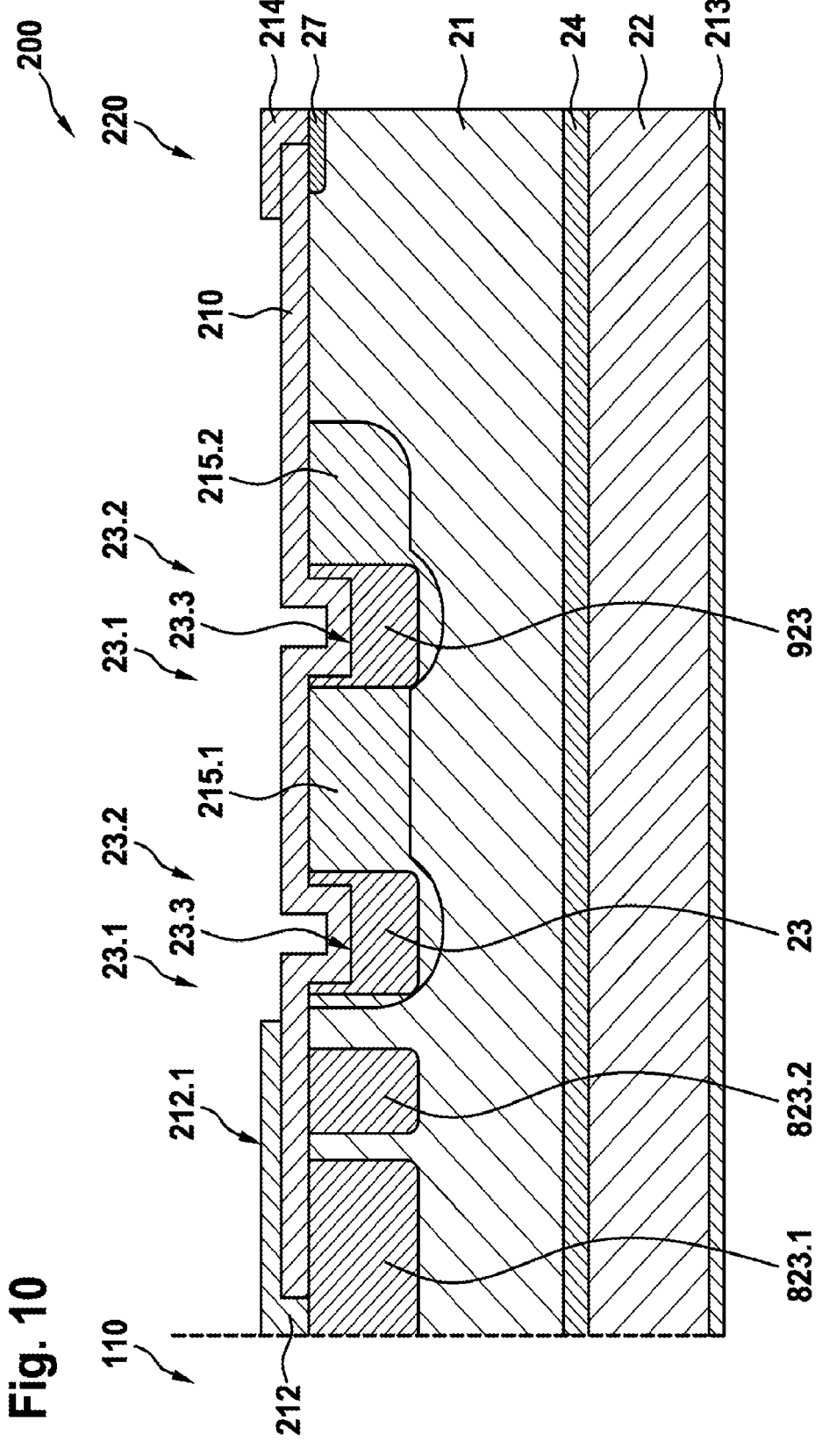

In one embodiment, as illustrated in FIG. 10, multiple ones of the floating shielding structures 23, 923 may also be structured with a shielding structure-trench structure 23.3, and optionally also all second shielding structures 823.1, 823.2, 823.3. An edge termination structure 215.1, 215.2, which at least partially encloses allocated shielding structure 23, 923, may be allocated to each shielding structure 23, 923 having a second region 23.2 or shielding structure-trench structure 23.3. In the embodiment illustrated in FIG. 10, at least two adjacent edge termination structures 215.1, 215.2 may touch each other, transition into each other, be set up in connected form or as one piece.

Figure 11:
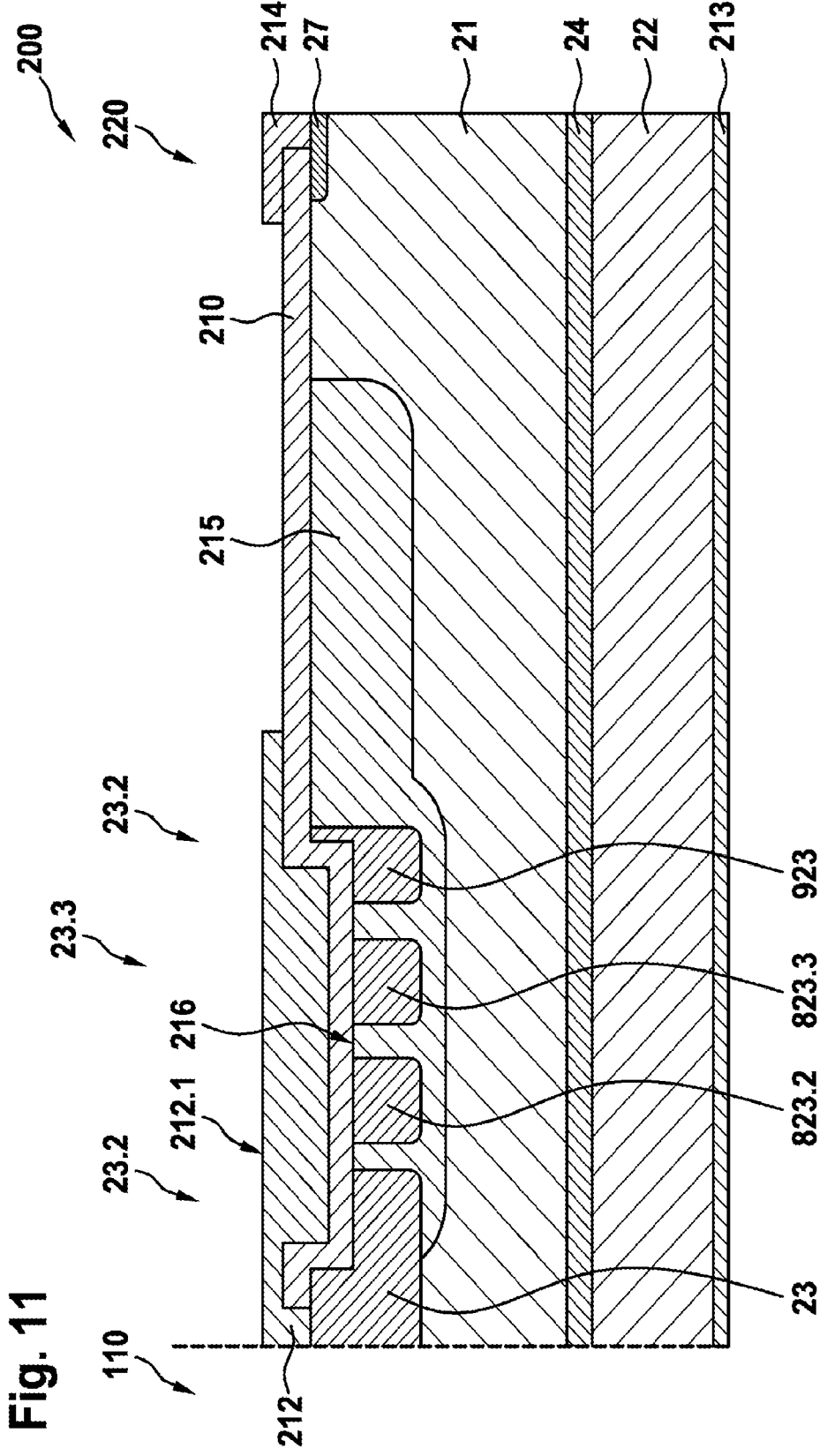

FIG. 11 illustrates an embodiment in which shielding structure-trench structure 23.2 laterally extends across multiple shielding structures. As illustrated, shielding structure-trench structure 23.2 starts in shielding structure 23, extends across second shielding structures 823.2, 823.3, and ends in third shielding structure 923, which lies closest to channel stopper 27. Edge termination structure 215 jointly encloses multiple of shielding structures 23, 823.2, 823.3, 923.

Figure 12:
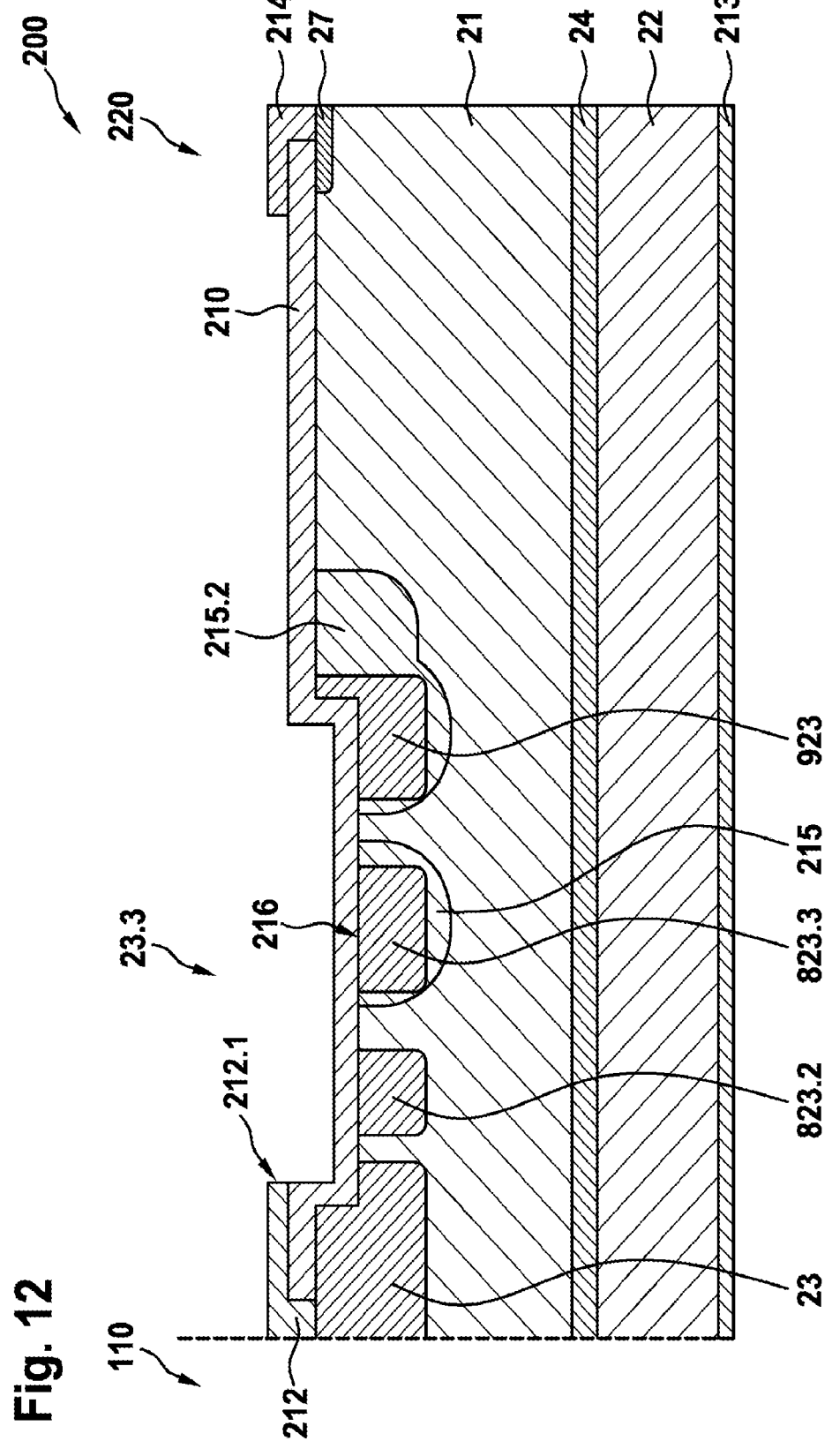
Figure 13:
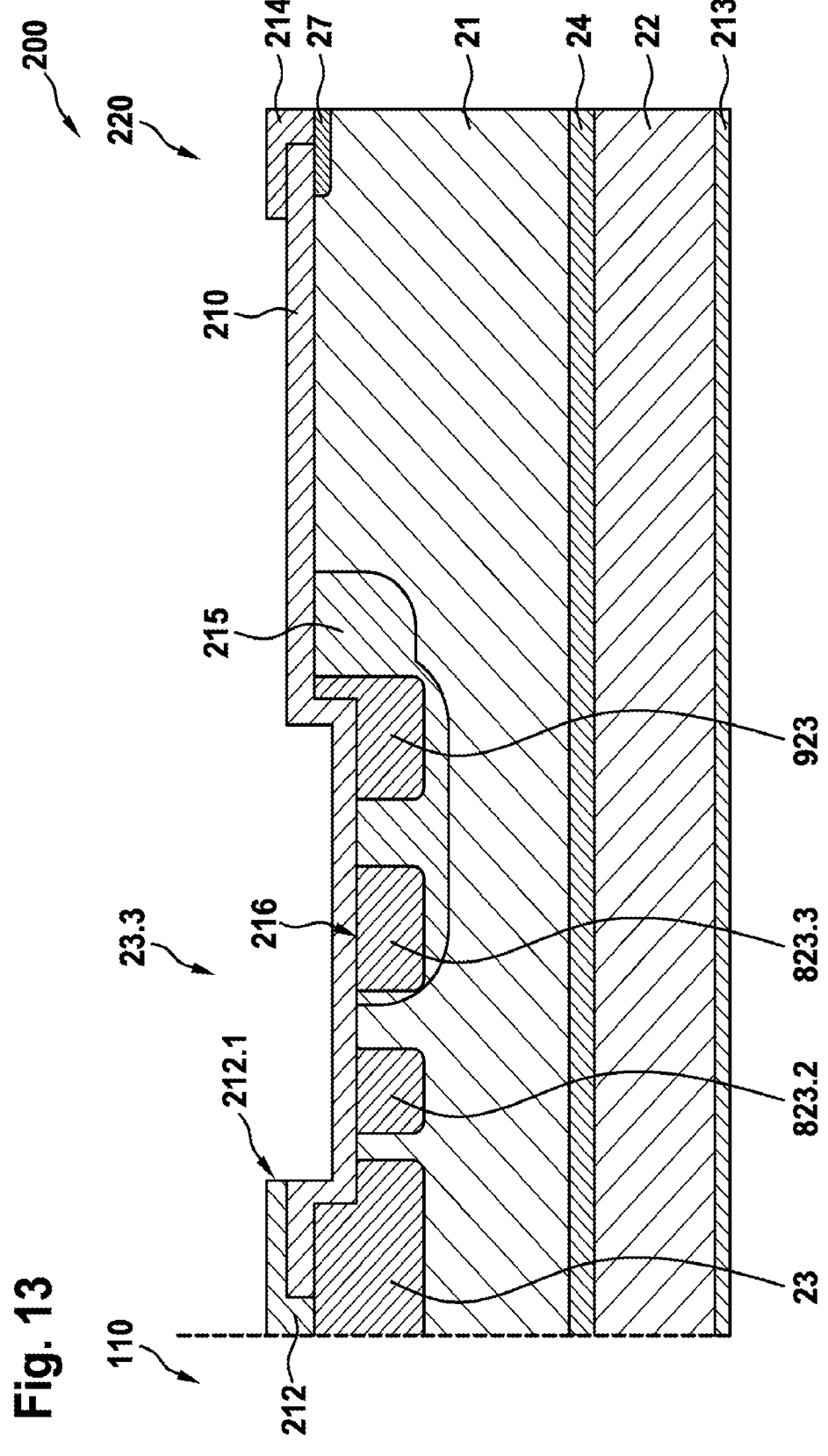

Similar to the embodiment shown in FIG. 11, FIG. 12 and FIG. 13 illustrate embodiments in which an (FIG. 13) edge termination structure 215 is developed, or multiple edge termination structures 215 which are separated from one another (FIG. 13), and which at least partially enclose one (FIG. 12) or multiple (FIG. 13) shielding structure(s) 23, 823.2, 823.3, 923. The number of shielding structures is not restricted to three, and the number of edge termination structures 215 is not restricted to two.

Figure 14:
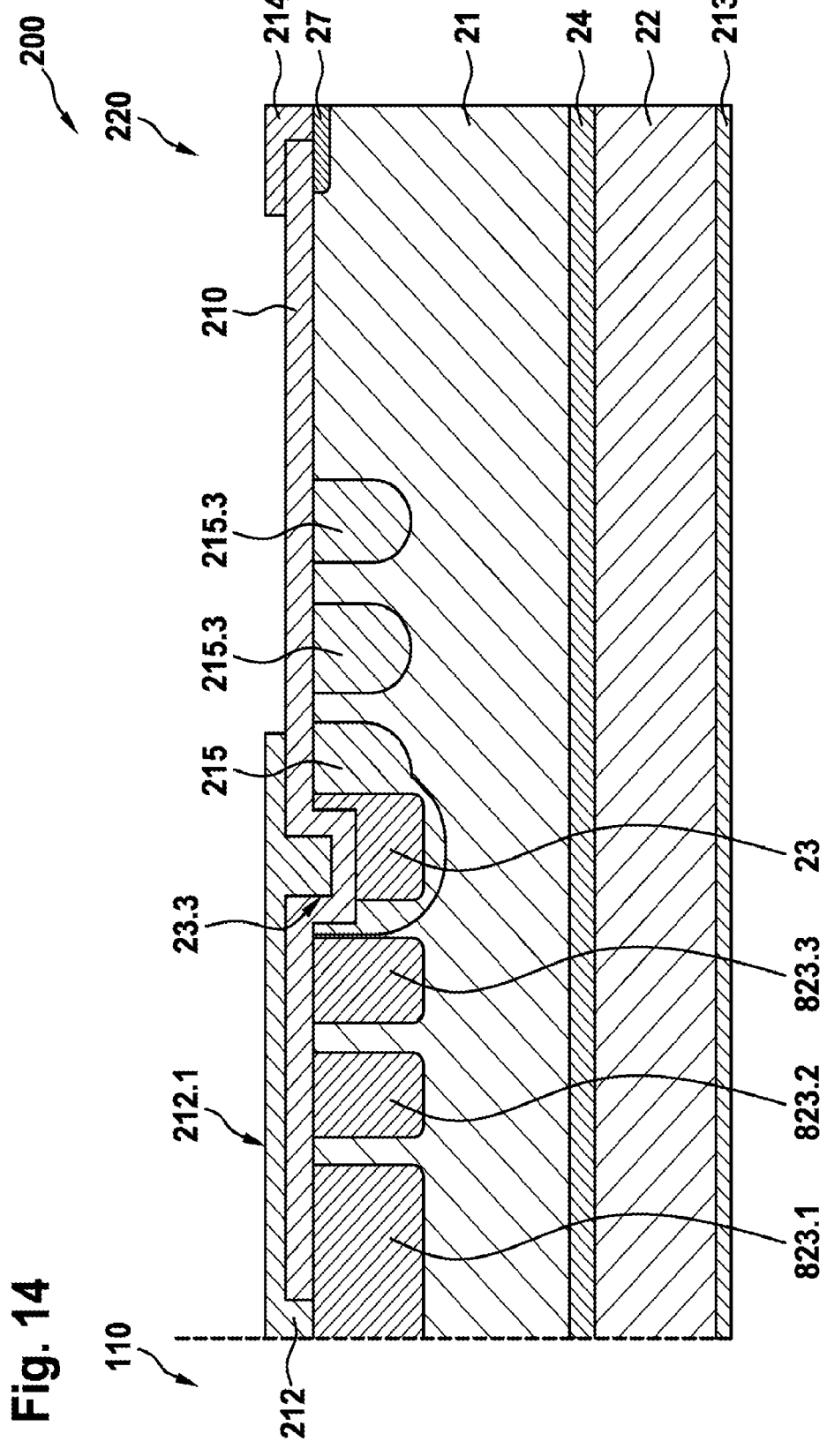

Similar to the embodiment illustrated in FIG. 8, FIG. 14 illustrates an embodiment in which further edge termination structures 215.3, e.g., in annular and/or concentric form, are developed between edge termination structure 215 allocated to shielding structure 23 and channel stopper 27. Edge termination structure 215 encloses shielding structure 23 at least partially or, for instance, laterally and fully in the direction of semiconductor substrate 22.

Figure 15:
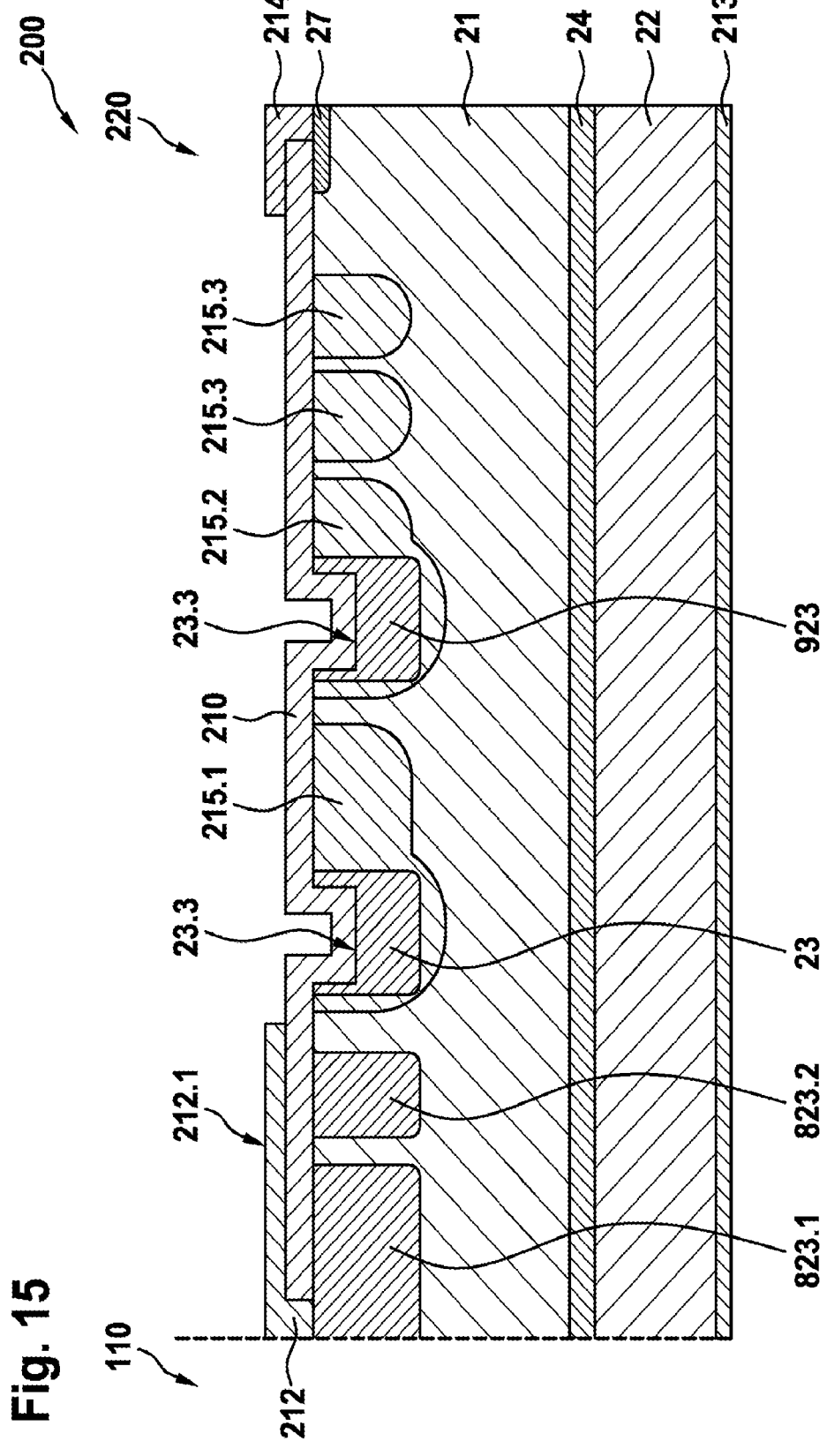

In one embodiment, which is illustrated in FIG. 15, it is also possible for multiple of floating shielding structures 23, 923 to be structured with a shielding structure-trench structure 23.3; optionally, also a few or all of second shielding structures 823.1, 823.2. Each shielding structure 23, 923 having a shielding structure-trench structure 23.2 is allocated an edge termination structure 215.1, 215.2, which at least in part encloses shielding structure 23, 923. Respective shielding structure-trench structure 23.3 may also be fully situated within respective shielding structure 23, 923. One or more further edge termination structure(s) 215.3 may be situated upstream from channel stopper 27.

Figure 16:
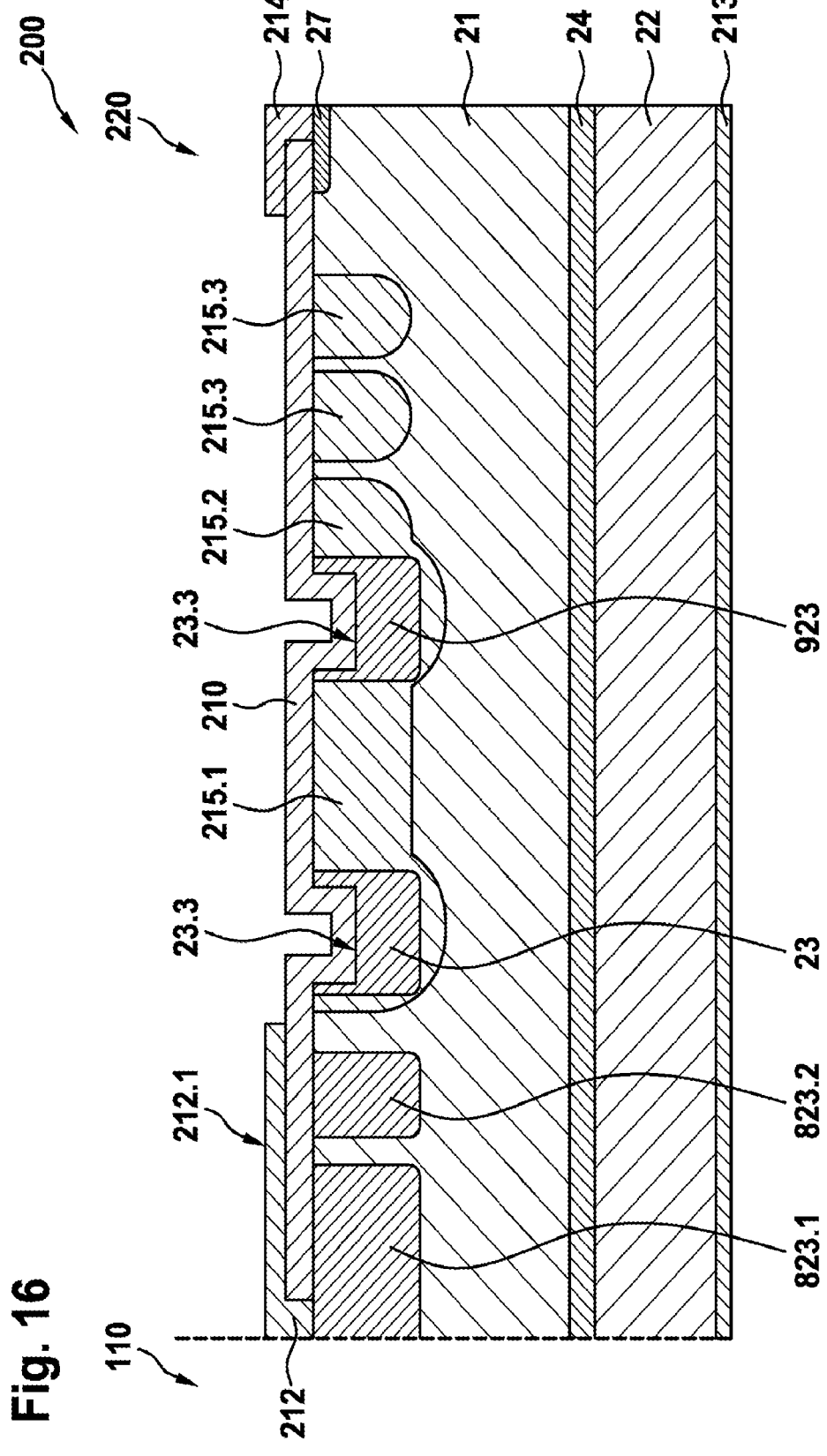

As the embodiment shown in FIG. 15, FIG. 16 illustrates an embodiment in which shielding structures 23, 923 are at least partially surrounded by a shared edge termination structure 215.1, similar to the embodiments illustrated in FIG. 10, FIG. 11 and FIG. 13.

Figure 17:
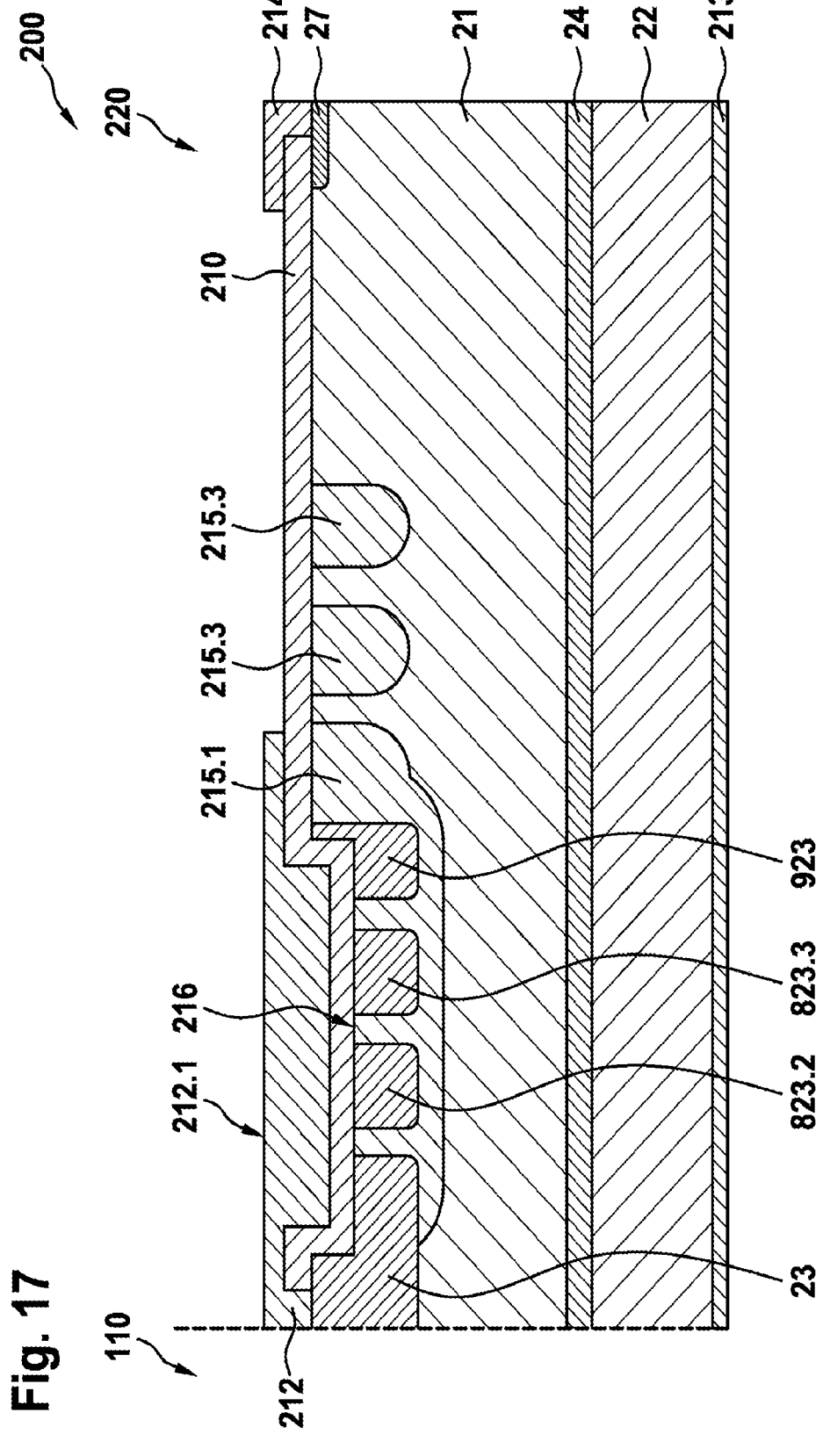

FIG. 17 illustrates an embodiment which is similar to the embodiment shown in FIG. 11; in this case, at least one further edge termination structure 215.3 is developed upstream from channel stopper 27, similar to the embodiments illustrated in FIG. 14 to FIG. 16.

Figure 18:
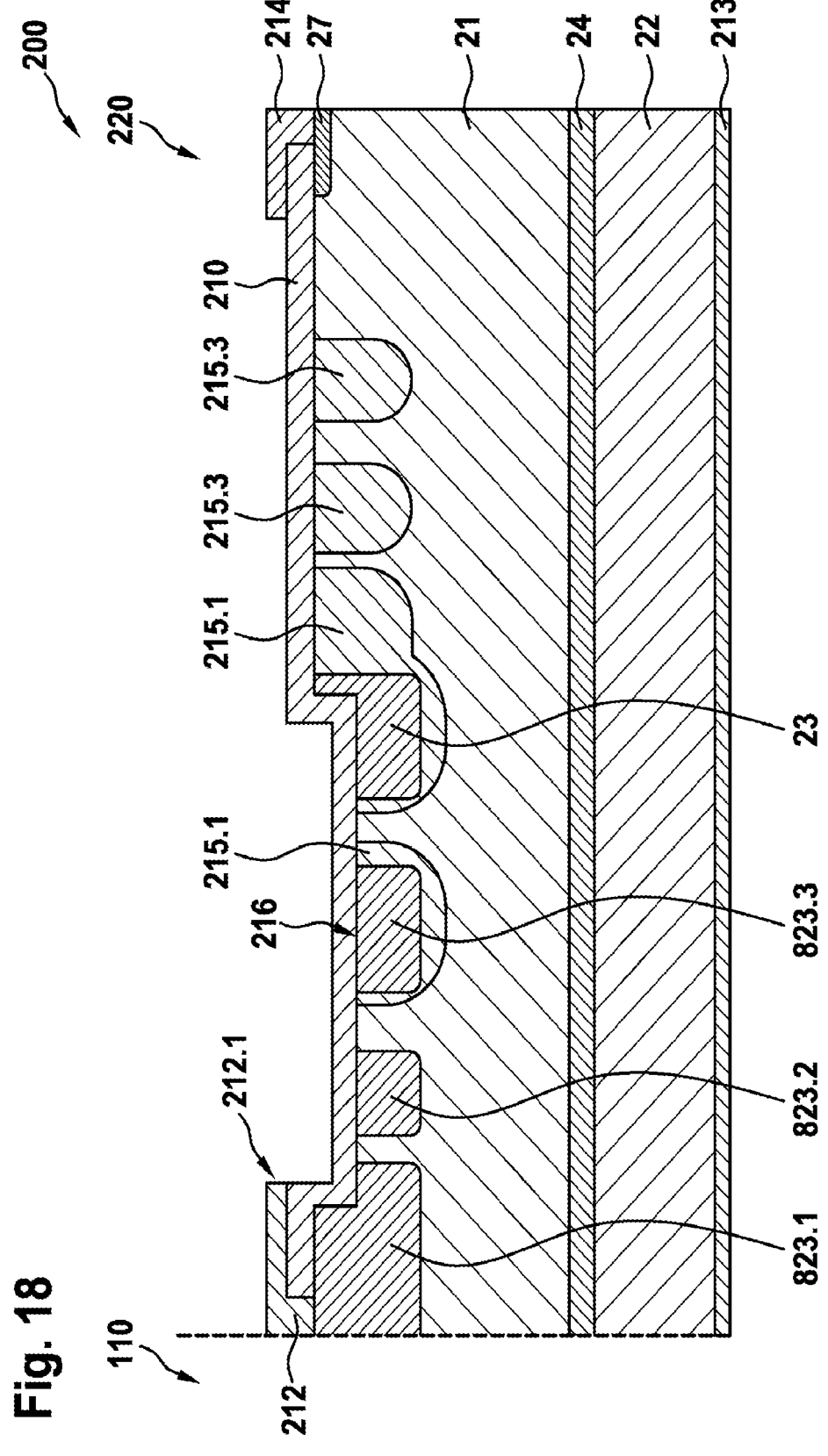

FIG. 18 illustrates an embodiment that is similar to the embodiment shown in FIG. 12; in this case, at least one further edge termination structure 215.3 is developed upstream from channel stopper 27, like in the embodiments illustrated in FIG. 14 to FIG. 16.

Figure 19:
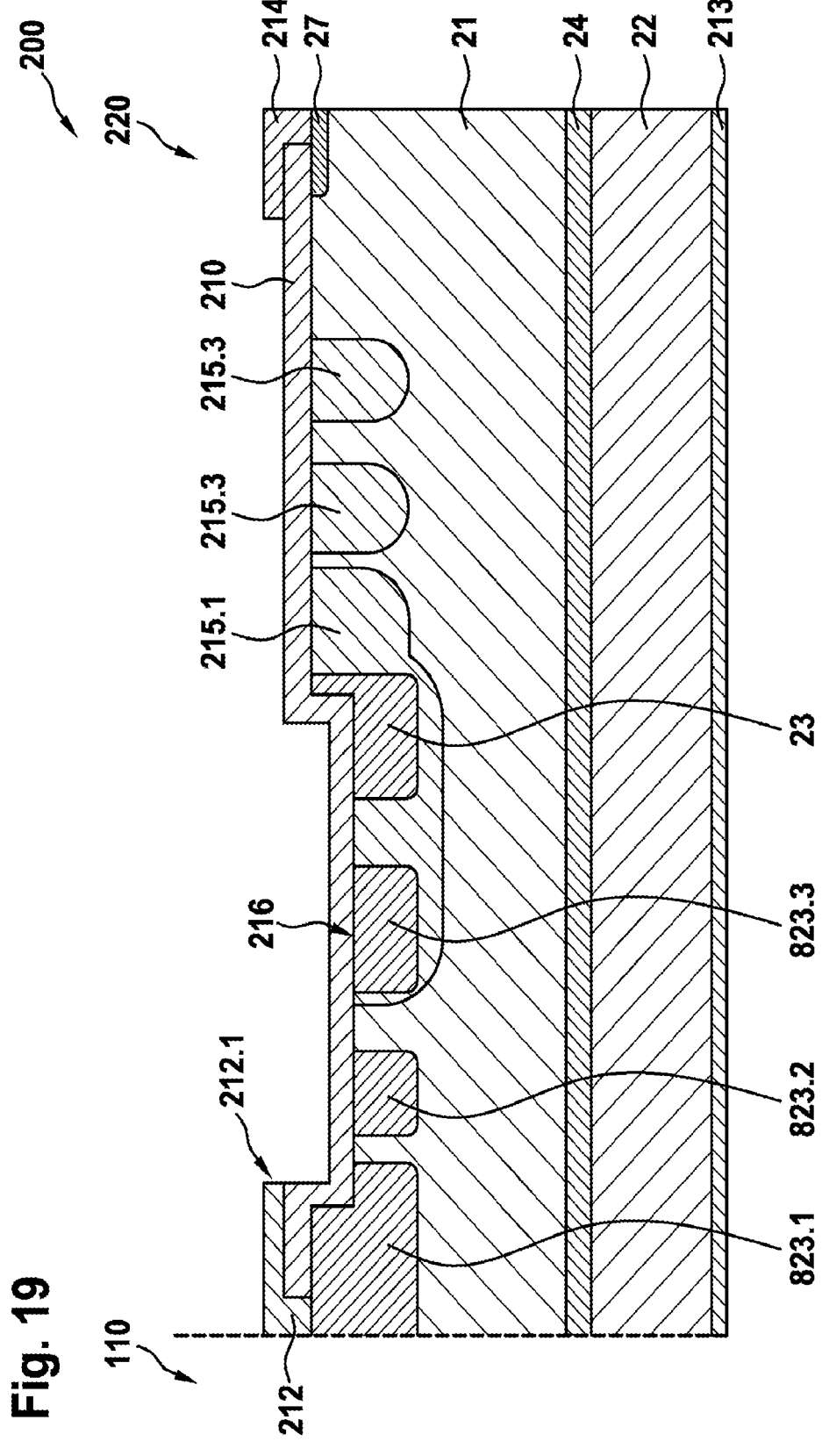

FIG. 19 illustrates an embodiment that is similar to the embodiment shown in FIG. 13; in this case, at least one further edge termination structure 215.3 is developed upstream from channel stopper 27, like in the embodiments illustrated in FIG. 14 to FIG. 16.

Although the description was provided based on an n-channel SiC trench MOSFET, the embodiments are not restricted to such but may also be applied to other power components having a deep p+ region. For instance, by exchanging n-dopings for p-dopings and the arithmetic signs of the potentials to p-channel-SiC trench MOSFETS or planar MOSFETs, for example. In addition, silicon or also other wide bandgap semiconductors such as GaN are able to be used as the semiconductor material.

In different embodiments, an n-doped drift region 21 is situated on an n-doped semiconductor substrate 22 in edge termination 220 of semiconductor component 200. Optionally, an n-doped nBuffer region 24 may be situated between semiconductor substrate 22 and drift region 21. In edge termination 220, vertical semiconductor component 200 may furthermore have a p-doped edge termination structure 215. In addition, a heavily n-doped (n+) channel stopper 27 and/or a channel-stop metal 214 are able to be provided in edge termination 220. In other words, edge termination 220 may include edge termination structure 215 and be flanked by parts of shielding structure 23 and channel-stop metal 214.

In different embodiments, vertical semiconductor component 200 has a drift region of a first conductivity type. A trench structure is developed in the active region on or above drift region 21. Gate electrode 11 is developed in the trench structure, as illustrated in FIG. 1 and described in the text above.

In different embodiments, drift region 21 is n-conductive, and shielding structure 23 has at least one p-conductive region.

A shielding structure 23 is laterally situated next to at least one sidewall of the trench structure on or above drift region 21, for instance in edge termination 220 and/or in active region 110, e.g., in the transition region from active region 110 to edge termination 220. Shielding structure 23 has a second conductivity type, which differs from the first conductivity type. Shielding structure 23 has at least one first region 23.1 which has a first thickness and a second region 23.2 which has a second thickness that is less than the first thickness.

Within the framework of this description, the thickness of a structure is understood as a spatial extension of the structure in a direction perpendicular to the main processing plane during the production of the structure. For instance, the thickness of shielding structure 23 is the dimension of shielding structure 23 from the side that is situated opposite the surface of semiconductor substrate 22, to the side that lies opposite source electrode 212.

An edge termination structure 215 is situated on or above drift region 21. Edge termination structure 215 has the second conductivity type. Shielding structure 23 has a first doping degree, and edge termination structure 215 has a second doping degree that differs from the first doping degree.

Within this description, the doping degree is understood as the number of dopant atoms per cm 3 in a doped region and may be indicated as a function of the number by the addition of "−−", "−", without addition, "+" or "++", as usual in this technical field, e.g., n+ doped region (a heavily n-doped region) or p– doped region (a lightly p-doped region).

At least in second region 23.3 of shielding structure 23, edge termination structure 215 is disposed between drift region 21 and shielding structure 23. The expression "in second region" may be understood in such a way that the edge termination structure is situated below and/or next to second region 23.2 of shielding structure 23, between shielding structure 23 and drift region 21, so that they are at least locally separated from each other with the aid of edge termination structure 215. This shifts the pn-junction, and the lateral breakdown strength is reinforced.

Edge termination structure 215 may laterally contact second region 23.2 of shielding structure 23.

Figure 2:
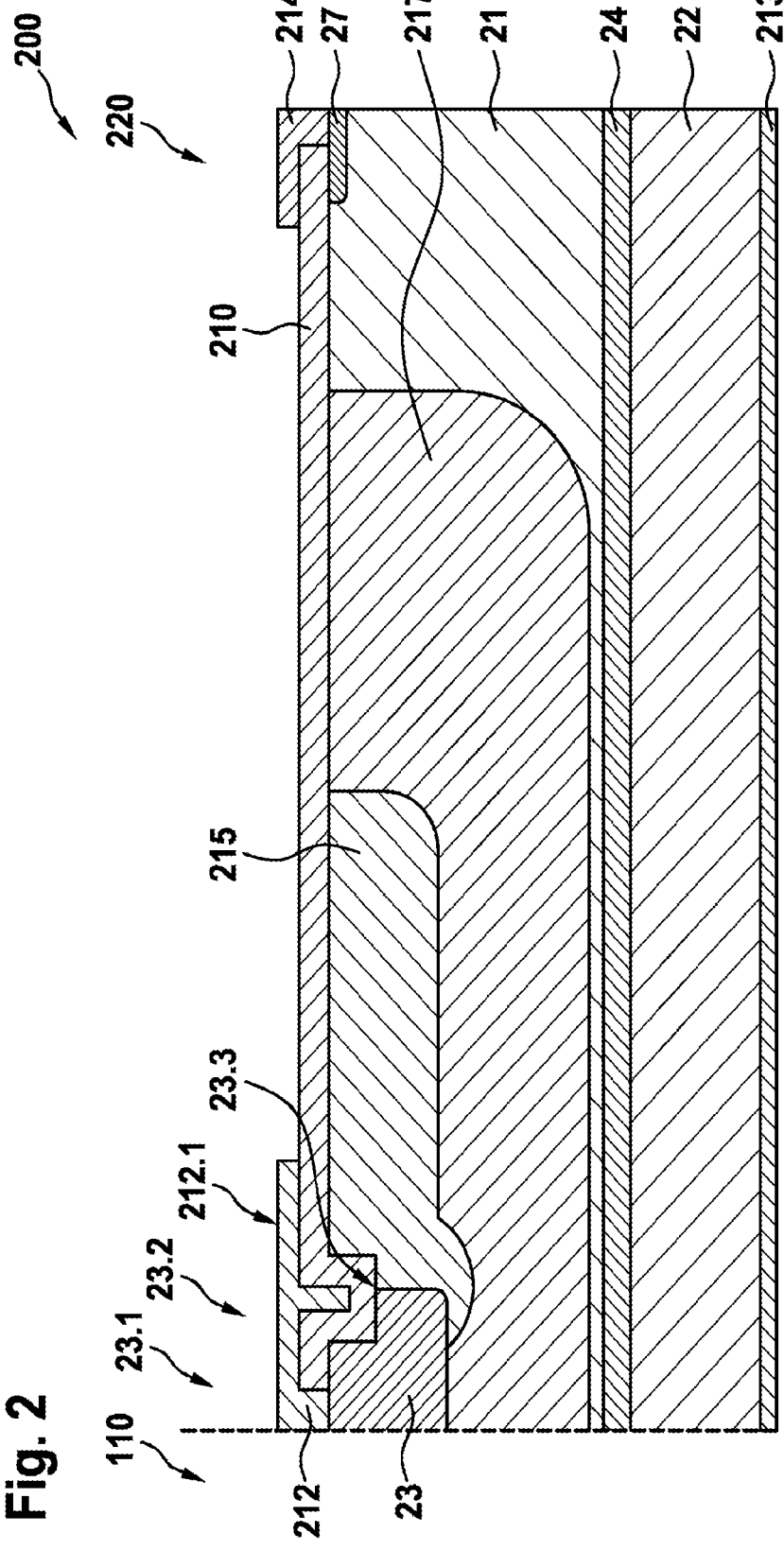
FIGS. 2 to 19 show schematic representations of a vertical semiconductor component according to different embodiments of the present invention.

Vertical semiconductor component 200 may include a source/drain electrode (such as a source electrode) 212, and shielding structure 23 may be connected to source-drain electrode 212 in an electrically conductive manner, as illustrated in FIG. 2. As an alternative, shielding structure 23 may be electrically insulated from source/drain electrode 212, as illustrated in FIG. 8.

In different embodiments, a dielectric structure 210 is at least partially situated on or above first region 23.1 and second region 23.2 of shielding structure 23.

In different embodiments, a source/drain electrode 212 and a dielectric structure 210 are developed on or above drift region 21. Source/drain electrode 212 is situated above edge termination structure 215, and dielectric structure 210 is situated between edge termination structure 215 and source-drain electrode 212.

In different embodiments, shielding structure 23 has a trench structure 23.3 (also referred to as shielding structure-trench structure), and second region 23.2 may be disposed in a bottom 216 of trench structure 23.3, as illustrated in FIG. 4. For instance, trench structure 23.3 has at least one of the following shapes: a rectangular shape, a V-shape, a W-shape, or a U-shape.

By way of example, prior to the implantation of edge termination structure 215 semiconductor component 200 according to different embodiments has a shielding structure-trench structure 23.3 in edge region 220 in the area of the lateral end of shielding structure 23. Edge termination structure 215 may be developed without the need of a higher implantation energy in comparison with the implantation energy of shielding structure 23.

At least at the lateral end of shielding structure 23, edge termination structure 215 may have a development that is not significantly flatter (when viewed from the upper surface) than the pn-junction of the p+ doped shielding structure 23/of n-drift region 21. In this way, for instance, no higher implantation energy is required for the development of edge termination structure 215 than for the development of the p+ doped shielding structure 23. As a result, the expense involved in the production of edge termination structure 215 is able to be reduced.

In different embodiments, at least one second shielding structure 823.1, 823.2, 823.3 is laterally situated between shielding structure 23 and the sidewall of the trench structure, as illustrated in FIG. 8 (FIG. 8 shows three second shielding structures 823.1, 823.2, 823.2 by way of example). The at least one second shielding structure 823.1, 823.2, 823.3, for instance, has the second conductivity type and a third doping degree. In one exemplary embodiment, the at least one second shielding structure 823.1, 823.2, 823.3 includes at least one region which has the first thickness and another region which has the second thickness that is less than the first thickness, as illustrated in FIG. 18, for instance.

Edge termination structure 215 may at least partially be positioned between shielding structure 23 and at least one second shielding structure 823.1, 823.2, 823.3.

In different embodiments, edge termination structure 215 is able to be set up in such a way that shielding structure 23 is separated from drift region 21. In different embodiments, edge termination structure 215 may be developed to separate shielding structure 23 and the at least one second shielding structure 823.1, 823.2, 823.3 from drift region 21.

Second region 23.2 of shielding structure 23 may be situated on the side of shielding structure 23 that is situated at a greater distance from the sidewall of the trench structure, as illustrated in FIG. 2. As an alternative, second region 23.2 of shielding structure 23 is disposed on the side of shielding structure 23 that is situated at a shorter distance from the sidewall of the trench structure.

In different embodiments, a third shielding structure 923 and a second edge termination structure 215.2 may be developed on or above drift region 21, as illustrated in FIG. 10 and FIG. 12, for example. Shielding structure 23 is laterally disposed between third shielding structure 923 and the sidewall of the trench structure. Third shielding structure 923 has the second conductivity type and a fourth doping degree. Third shielding structure 923 has at least one third region 23.1 having a third thickness and a fourth region 23.2 having a fourth thickness that is less than the third thickness. Second edge termination structure 215.2 has the second conductivity type and a fifth doping degree, which differs from the fourth doping degree. At least in the fourth region of third shielding structure 923, second edge termination structure 215.2 is situated between drift region 21 and third shielding structure 923. Edge termination structure 215 may be developed to separate shielding structure 23 and third shielding structure 923 from drift region 21. At least one second shielding structure 823.1, 823.2 may be situated laterally between shielding structure 23 and third shielding structure 923.

In different embodiments, a channel stopper 214 (channel-stop structure) is developed on or above drift region 21. Shielding structure 23 may be disposed between the sidewall of the trench structure and channel stopper 214. Second region 23.2 of shielding structure 23 may be situated on the side of shielding structure 23 that is disposed at a greater distance from channel stopper 214.

In different embodiments, a channel stopper 214 is situated on or above drift region 21, and a further edge termination structure 215.3 is situated between shielding structure 23 and channel stopper 214.

For example, shielding structure 23 and at least one of the second and third shielding structures 823.1, 823.2, 823.3, 923 is separated from drift region 21 with the aid of a shared edge termination structure 215.1.

Figure 20:
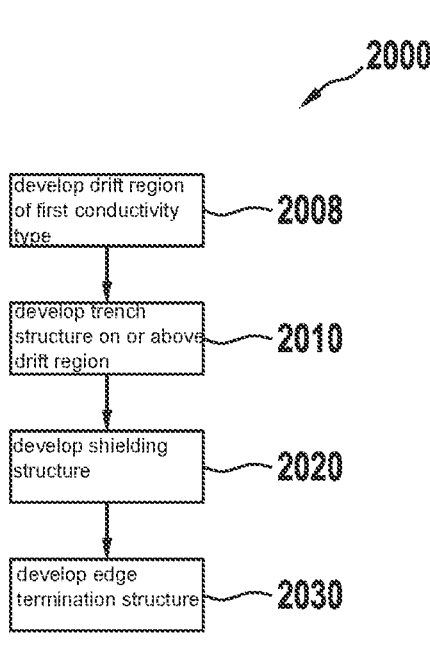
FIG. 20 shows a flow diagram of a method for producing a vertical semiconductor component according to different embodiments of the present invention.

FIG. 20 shows a flow diagram of a method 200 for developing a vertical semiconductor component according to different embodiments. For example, in the following text, features have been provided with reference numerals in exemplary embodiments shown in FIGS. 2 through 19.

In different embodiments, method 2000 for developing a vertical semiconductor component includes the following: Developing (in 2008) a drift region of a first conductivity type; developing (in 2010) a trench structure on or above drift region 21, developing (in 2020) a shielding structure 23, which is laterally situated next to at least one sidewall of the trench structure on or above drift region 21, shielding structure 23 having a second conductivity type that differs from the first conductivity type, and shielding structure 23 has at least a first region 23.1 having a first thickness and a second region 23.2 having a second thickness that is less than the first thickness; and developing (in 2030) an edge termination structure 215 on or above drift region 21, edge termination structure 215 having the second conductivity type, and shielding structure 23 having a first doping degree, and edge termination structure 215 having a second doping degree that differs from the first doping degree; and at least in the second region of shielding structure 23, edge termination structure 215 is situated between drift region 21 and shielding structure 23.

For example, shielding structures 23, 823.1, 823.2, 823.3, 923 and edge termination structures 215.1, 215.2, 215.3 may be developed with the aid of an ion implantation, e.g., using an aluminum ion implantation in the case of an SiC trench structure or an SiC drift region, or using Mg ions in the case of a GaN trench structure or a GaN drift region. To supply shielding structures or edge termination structures deeply embedded in the drift region without a high-energy ion implantation, a shielding structure-trench structure is able to be developed, in whose bottom 216 the implantation takes place.

In different embodiments, a few or all shielding structures 23, 823.1, 823.2, 823.3, 923 and edge termination structures 215.1, 215.2, 215.3 may be developed with the aid of what is known as a TOT implantation. In the process, the shielding structures or edge termination structures are developed by implanting an ion species, e.g., argon ions, which causes no doping in the SiC or GaN drift region. These shielding structures or edge termination structures are electrically no longer conductive. Their shielding effect thus remains. A connection of such electrically non-conductive shielding structures to the source electrode is optional.

Figure 5:
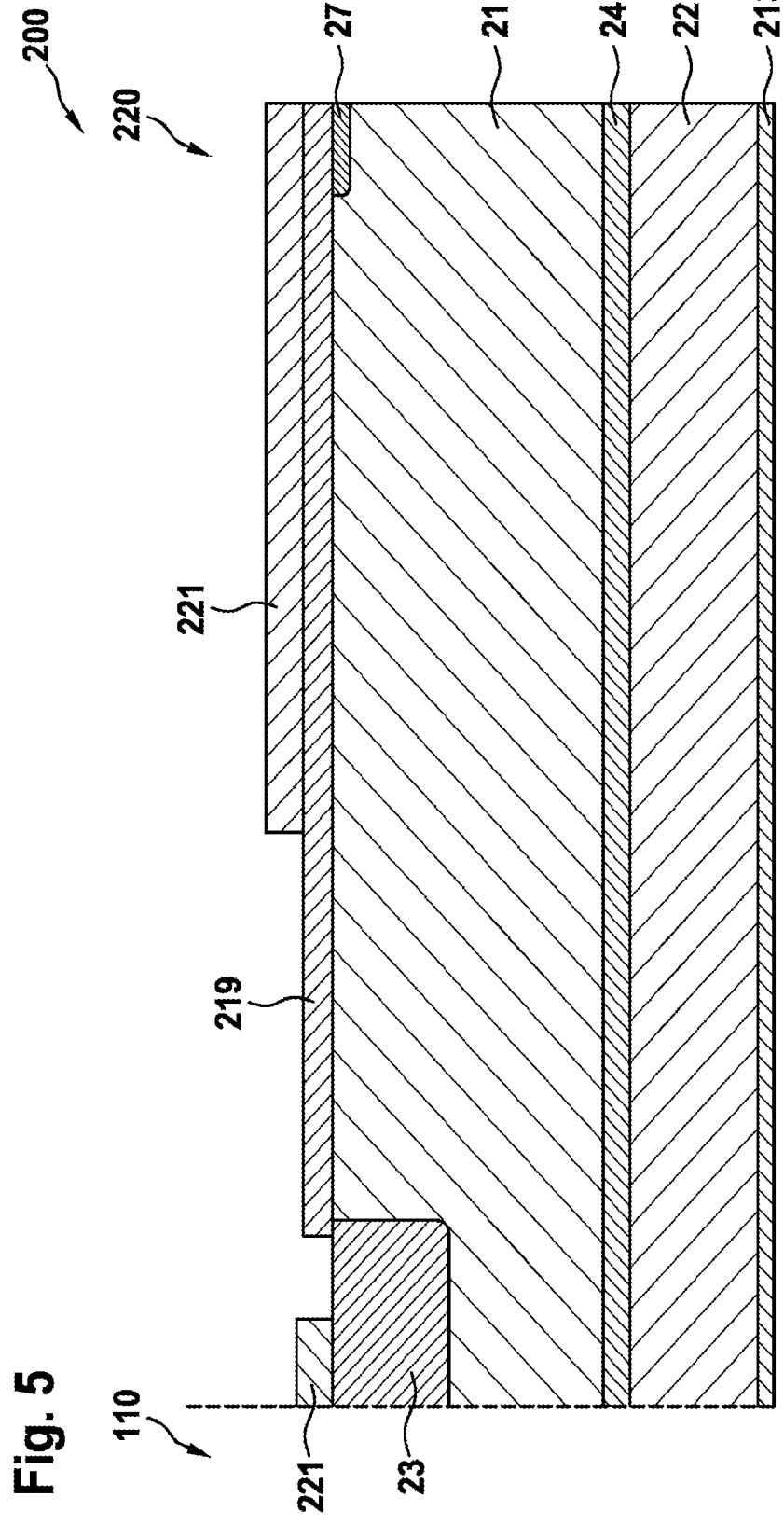
Figure 6:
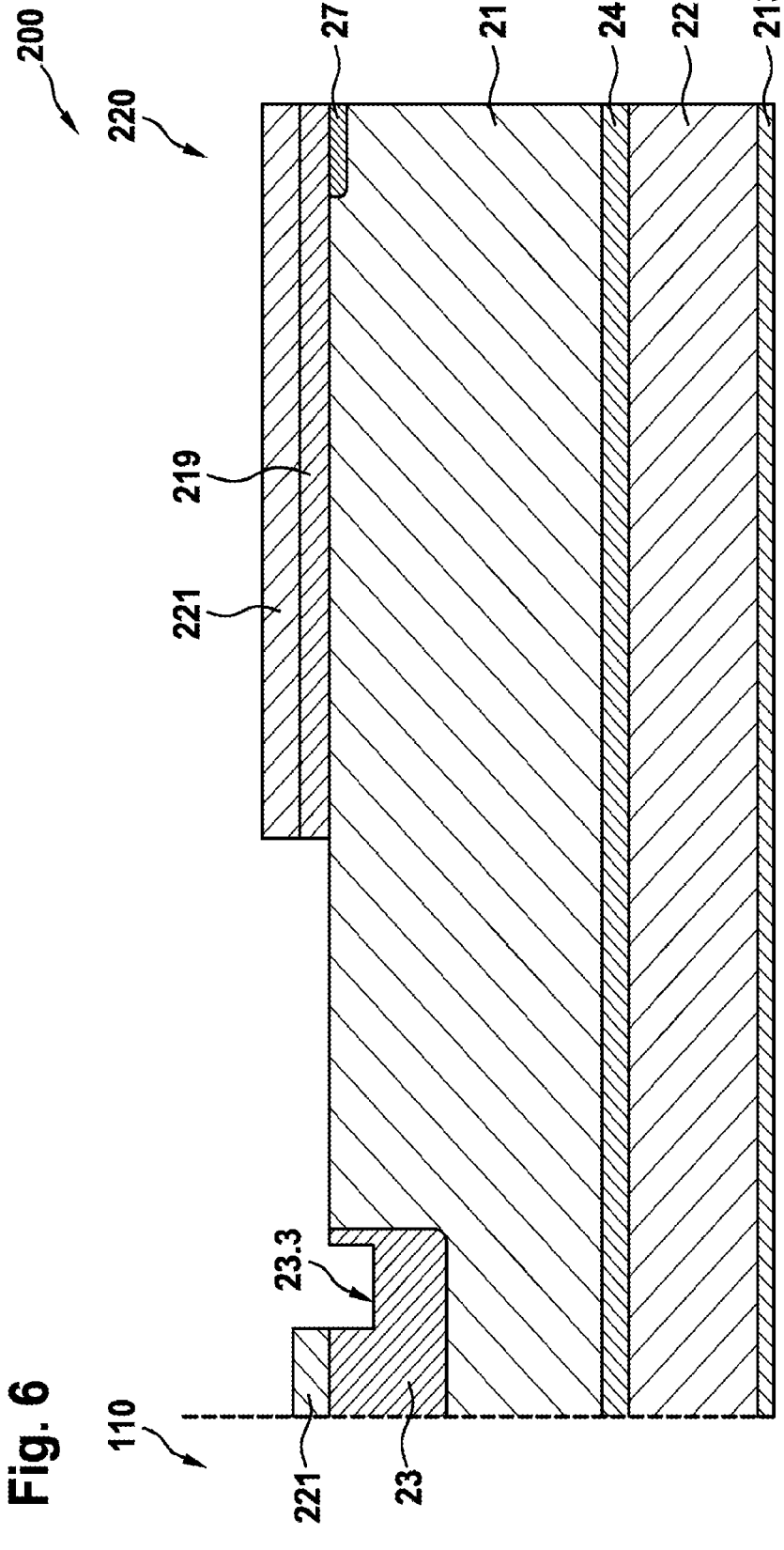
Figure 7:
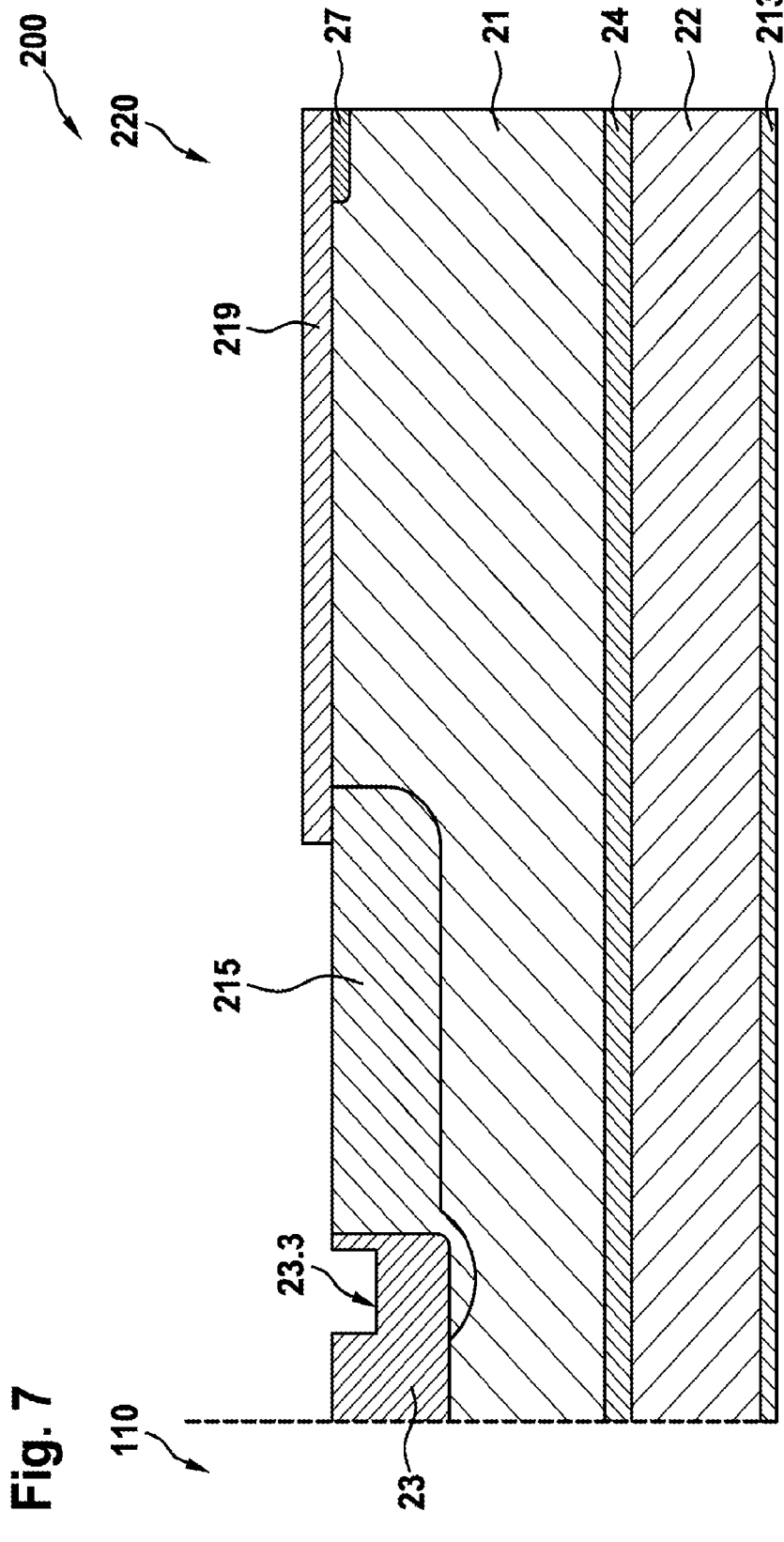

According to different embodiments, an edge termination 220, as illustrated in FIG. 5 to FIG. 7, can be produced with the aid of a method which includes: supplying a wafer/substrate 22 of a semiconductor material such as SiC; developing, e.g., growing, material of the same composition with a differing doping, such as with the aid of epitaxy;

Doping functional layers of a suitable doping using suitable masks, e.g., by implanting the following regions: nSource 6, n+ channel stopper 27 (optional), pchannel 5, nSpreading 8 (optional), p+ shielding structure 23, further p+ shielding structures 823.1, 823.2, 823.3, 923 (optional), developing the shielding structure-trench structure 23.2.

In addition, the present method may include doping of further functional layers with a suitable doping using suitable masks, such as by implantations of the following regions: edge termination structures 215, 215.1, 215.2, 215.3 (optional), thermal treatment to activate the dopants.

Moreover, the method may include structuring of the MOS head, for instance setting up a gate trench structure using a suitable mask, applying a dielectric such as a gate oxide 9, e.g., SiO$_2$, applying a gate electrode 11, e.g., polysilicon.

Thermal treatments using different gases are optional following each of the preceding steps.

The method may furthermore include: developing a dielectric structure 10, 210, for instance applying one or more insulation layers 10, 210, developing electrodes 12, 212.1 on parts of the front side of semiconductor substrate 22, applying front-side metallizations 212 and passivations (not shown) using suitable masks and processes to the top surface of the semiconductor component, and applying a drain metallization 213 following an optional thin-grinding of the wafer to the rear side of the wafer using suitable processes.

One embodiment of the part of the process control which shows a p+ shielding structure 23, a shielding structure-trench structure 23.3, and an edge termination structure 215 is illustrated in FIG. 5 to FIG. 7 for edge termination 220. This allows for an at least partially self-adjusting production of shielding structure-trench structure 23.3 and edge termination structure 215 for shielding structure 23.

According to FIG. 5, after shielding structure 23 has been produced with the aid of p+ mask 219, it is possible to apply the pEdge mask 221 and to structure it photolithographically. According to FIG. 6, the etching of p+ mask 219 using the pEdge mask 221 as masking may be carried out, and shielding structure-trench structure 23.3 is able to be developed at the same time. Its edge pointing in the direction of channel stopper 27 may thereby be self-adjusting relative to p+ shielding structure 23 and, as illustrated in FIG. 6, may just still be positioned within the base area of p+ shielding structure 23. According to FIG. 7, the implantation of edge termination structure 215 may be carried out. This method sequence is able to be implemented at the indicated point of the production method or at a different suitable point of the production method.

The embodiments described and illustrated in the figures have been selected merely by way of example. Different embodiments may be combined with one another either completely or with regard to individual features. It is also possible to supplement one embodiment with features of a further embodiment. In addition, described method steps may be repeated and carried out in a sequence other than the one described. In particular, the present invention is not restricted to the indicated method.

What is claimed is:

1. A vertical semiconductor component, comprising:
a drift region having a first conductivity type;
a trench structure on or above the drift region;
a shielding structure which is laterally situated next to at least one sidewall of the trench structure on or above the drift region, the shielding structure having a second conductivity type that differs from the first conductivity type, and the shielding structure having at least a part of a shielding structure-trench structure such that the shielding structure has at least one first region having a first thickness and a second region having a second thickness that is less than the first thickness; and
an edge termination structure on or above the drift region, the edge termination structure having the second conductivity type;
wherein the shielding structure has a first doping degree, and the edge termination structure has a second doping degree that differs from the first doping degree; and
wherein, across an entire width of the second region of the shielding structure, the edge termination structure is situated between the drift region and the shielding structure.

2. The vertical semiconductor component as recited in claim 1, further comprising:
a source/drain electrode and a dielectric structure, the source/drain electrode being situated above the edge termination structure, and the dielectric structure being situated between the edge termination structure and the source/drain electrode.

3. The vertical semiconductor component as recited in claim 2, wherein the shielding structure is electrically insulated from the source/drain electrode.

4. The vertical semiconductor component as recited in claim 1, wherein the drift region is n-conductive, and the shielding structure has at least one p-conductive region.

5. The vertical semiconductor component as recited in claim 1, wherein the edge termination structure laterally contacts the second region of the shielding structure.

6. The vertical semiconductor component as recited in claim 1, further comprising:

at least one second shielding structure, which is situated laterally between the shielding structure and the sidewall of the trench structure, the second shielding structure having the second conductivity type and a third doping degree.

7. The vertical semiconductor component as recited in claim 1, wherein the edge termination structure separates the shielding structure from the drift region.

8. The vertical semiconductor component as recited in claim 1, further comprising:

a third shielding structure, the shielding structure being laterally situated between the third shielding structure and the sidewall of the trench structure, the third shielding structure having the second conductivity type and a fourth doping degree, and the third shielding structure having at least one third region having a third thickness and a fourth region having a fourth thickness that is less than the third thickness; and a second edge termination structure on or above the drift region, the second edge termination structure having the second conductivity type and a fifth doping degree that differs from the fourth doping degree, wherein at least in the fourth region of the third shielding structure, the second edge termination structure being situated between the drift region and the third shielding structure.

9. The vertical semiconductor component as recited in claim 1, further comprising:

a channel stopper on or above the drift region; and a further edge termination structure, the further edge termination region being situated between the shielding structure and the channel stopper.

10. A method for developing a vertical semiconductor component, the method comprising the following steps:

developing a drift region having a first conductivity type;

developing a trench structure on or above the drift region;

developing a shielding structure, which is situated laterally next to at least one sidewall of the trench structure on or above the drift region, the shielding structure having a second conductivity type that differs from the first conductivity type, and the shielding structure having at least a part of a shielding-structure/trench structure such that the shielding structure has at least one first region having a first thickness and a second region having a second thickness that is less than the first thickness; and developing an edge termination structure on or above the drift region, the edge termination structure having the second conductivity type, the shielding structure having a first doping degree and the edge termination structure having a second doping degree that differs from the first doping degree, wherein, across an entire width of the second region of the shielding structure, the edge termination structure is situated between the drift region and the shielding structure.

\* \* \* \* \*